(12) United States Patent
Ye

(10) Patent No.: US 7,994,508 B2
(45) Date of Patent: Aug. 9, 2011

(54) THIN FILM TRANSISTORS USING THIN FILM SEMICONDUCTOR MATERIALS

(75) Inventor: Yan Ye, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 176 days.

(21) Appl. No.: 12/184,914

(22) Filed: Aug. 1, 2008

(65) Prior Publication Data
US 2009/0050884 A1 Feb. 26, 2009

Related U.S. Application Data

(60) Provisional application No. 60/953,683, filed on Aug. 2, 2007.

(51) Int. Cl.
*H01L 29/04* (2006.01)
(52) U.S. Cl. ............... 257/63; 257/43; 257/E29.273; 257/E21.459
(58) Field of Classification Search .......... 257/43, 257/104, 149, 151, 158, 159, 162, 291, E21.411, 257/E21.459, E29.273, E29.296, 55, 63, 257/347; 438/149, 151, 158, 164
See application file for complete search history.

(56) References Cited

U.S. PATENT DOCUMENTS

| | | | |
|---|---|---|---|
| 4,436,770 A | 3/1984 | Nishizawa et al. | |
| 4,695,432 A * | 9/1987 | Colin et al. | 422/98 |
| 4,769,291 A | 9/1988 | Belkind et al. | |
| 4,816,082 A | 3/1989 | Guha et al. | |
| 4,983,360 A * | 1/1991 | Merdrignac et al. | 422/90 |
| 5,279,679 A | 1/1994 | Murakami et al. | |
| 5,346,601 A | 9/1994 | Barada et al. | |
| 5,352,300 A | 10/1994 | Niwa | |
| 5,420,452 A | 5/1995 | Tran et al. | |
| 5,522,934 A | 6/1996 | Suzuki et al. | |
| 5,571,749 A | 11/1996 | Matsuda et al. | |
| 5,620,523 A | 4/1997 | Maeda et al. | |

(Continued)

FOREIGN PATENT DOCUMENTS

CN 1588623 A 3/2005
(Continued)

OTHER PUBLICATIONS dit Picard et al., "Detection of NH3 and H2S with thick film semiconductor sensors based on Cd2-xGeO4-x-3yN2y oxynitrides", Sensors and Actuators B, vol. 42, 1997, pp. 47-51.*

(Continued)

*Primary Examiner* — Matthew C Landau
*Assistant Examiner* — Joseph C Nicely
(74) *Attorney, Agent, or Firm* — Patterson & Sheridan, L.L.P.

(57) ABSTRACT

The present invention generally comprises TFTs having semiconductor material comprising oxygen, nitrogen, and one or more element selected from the group consisting of zinc, tin, gallium, cadmium, and indium as the active channel. The semiconductor material may be used in bottom gate TFTs, top gate TFTs, and other types of TFTs. The TFTs may be patterned by etching to create both the channel and the metal electrodes. Then, the source-drain electrodes may be defined by dry etching using the semiconductor material as an etch stop layer. The active layer carrier concentration, mobility, and interface with other layers of the TFT can be tuned to predetermined values. The tuning may be accomplished by changing the nitrogen containing gas to oxygen containing gas flow ratio, annealing and/or plasma treating the deposited semiconductor film, or changing the concentration of aluminum doping.

16 Claims, 16 Drawing Sheets

U.S. PATENT DOCUMENTS

| | | |
|---|---|---|
| 5,668,663 A | 9/1997 | Varaprasad et al. |
| 5,683,537 A | 11/1997 | Ishii |
| 5,700,699 A | 12/1997 | Han et al. |
| 5,716,480 A | 2/1998 | Matsuyama et al. |
| 5,720,826 A | 2/1998 | Hayashi et al. |
| 5,731,856 A | 3/1998 | Kim et al. |
| 5,993,594 A | 11/1999 | Wicker et al. |
| 6,153,013 A | 11/2000 | Sakai et al. |
| 6,153,893 A | 11/2000 | Inoue et al. |
| 6,159,763 A | 12/2000 | Sakai et al. |
| 6,180,870 B1 | 1/2001 | Sano et al. |
| 6,228,236 B1 | 5/2001 | Rosenstein et al. |
| 6,238,527 B1 | 5/2001 | Sone et al. |
| 6,329,269 B1 | 12/2001 | Hamada et al. |
| 6,388,301 B1 | 5/2002 | Tawada et al. |
| 6,458,673 B1 | 10/2002 | Cheung |
| 6,617,054 B2* | 9/2003 | Hosokawa ............ 428/690 |
| 6,638,846 B2* | 10/2003 | Iwata et al. ............ 438/608 |
| 6,700,057 B2 | 3/2004 | Yasuno |
| 6,787,010 B2 | 9/2004 | Cuomo et al. |
| 6,881,305 B2 | 4/2005 | Black et al. |
| 6,943,359 B2 | 9/2005 | Vardeny et al. |
| 7,026,713 B2 | 4/2006 | Hoffman et al. |
| 7,145,174 B2 | 12/2006 | Chiang et al. |
| 7,158,208 B2 | 1/2007 | De Jager et al. |
| 7,189,992 B2 | 3/2007 | Wager, III et al. |
| 7,235,810 B1 | 6/2007 | Yamazaki et al. |
| 7,297,977 B2* | 11/2007 | Hoffman et al. ............ 257/43 |
| 7,309,895 B2* | 12/2007 | Hoffman et al. ............ 257/347 |
| 7,339,187 B2 | 3/2008 | Wager, III et al. |
| 7,378,286 B2 | 5/2008 | Hsu et al. |
| 7,382,421 B2 | 6/2008 | Hoffman et al. |
| 7,601,984 B2* | 10/2009 | Sano et al. ............ 257/57 |
| 7,626,201 B2 | 12/2009 | Chiang et al. |
| 7,629,191 B2 | 12/2009 | Chiang et al. |
| 7,750,440 B2 | 7/2010 | Yagi |
| 7,879,698 B2 | 2/2011 | Ye |
| 7,927,713 B2* | 4/2011 | Ye ............ 428/620 |
| 2002/0149053 A1 | 10/2002 | Tsunoda et al. |
| 2003/0008173 A1* | 1/2003 | Hosokawa ............ 428/690 |
| 2003/0015234 A1 | 1/2003 | Yasuno |
| 2003/0049464 A1 | 3/2003 | Glenn et al. |
| 2004/0235224 A1 | 11/2004 | Lin et al. |
| 2005/0017244 A1* | 1/2005 | Hoffman et al. ............ 257/72 |
| 2005/0028860 A1 | 2/2005 | Sano et al. |
| 2005/0181532 A1 | 8/2005 | Patel et al. |
| 2006/0033106 A1 | 2/2006 | Seo et al. |
| 2006/0046476 A1 | 3/2006 | Nakamura et al. |
| 2006/0065299 A1 | 3/2006 | Fukawa et al. |
| 2006/0108636 A1* | 5/2006 | Sano et al. ............ 257/347 |
| 2006/0125098 A1 | 6/2006 | Hoffman et al. |
| 2006/0258064 A1* | 11/2006 | Chen et al. ............ 438/149 |
| 2006/0286725 A1 | 12/2006 | Cheng et al. |
| 2007/0007125 A1 | 1/2007 | Krasnov et al. |
| 2007/0026321 A1 | 2/2007 | Kumar |
| 2007/0030569 A1 | 2/2007 | Lu et al. |
| 2007/0065962 A1 | 3/2007 | Pichler |
| 2007/0068571 A1 | 3/2007 | Li et al. |
| 2007/0098879 A1* | 5/2007 | Makiura ............ 427/66 |
| 2007/0141784 A1 | 6/2007 | Wager et al. |
| 2007/0194379 A1* | 8/2007 | Hosono et al. ............ 257/347 |
| 2007/0252129 A1* | 11/2007 | Yagi ............ 257/2 |
| 2007/0252147 A1 | 11/2007 | Kim et al. |
| 2007/0252152 A1 | 11/2007 | Sato et al. |
| 2008/0108198 A1 | 5/2008 | Wager et al. |
| 2008/0132009 A1* | 6/2008 | Hirai ............ 438/158 |
| 2008/0173870 A1 | 7/2008 | Kim et al. |
| 2008/0224133 A1 | 9/2008 | Park et al. |
| 2008/0264777 A1* | 10/2008 | Ye ............ 204/192.25 |
| 2008/0272388 A1* | 11/2008 | Ushiyama et al. ............ 257/98 |
| 2008/0308411 A1* | 12/2008 | Guo et al. ............ 204/192.15 |
| 2009/0023959 A1 | 1/2009 | D'Amore et al. |
| 2009/0026065 A1 | 1/2009 | Nukeaw et al. |
| 2009/0045398 A1* | 2/2009 | Kato et al. ............ 257/43 |
| 2009/0050884 A1 | 2/2009 | Ye |
| 2009/0212287 A1 | 8/2009 | Nathan et al. |
| 2009/0233424 A1* | 9/2009 | Ye ............ 438/482 |
| 2009/0236597 A1 | 9/2009 | Ye |
| 2009/0239335 A1* | 9/2009 | Akimoto et al. ............ 438/104 |
| 2009/0305461 A1* | 12/2009 | Akimoto et al. ............ 438/104 |
| 2010/0001274 A1 | 1/2010 | Ye |
| 2010/0001346 A1* | 1/2010 | Ye ............ 257/347 |
| 2010/0078633 A1* | 4/2010 | Watanabe ............ 257/43 |
| 2010/0090215 A1 | 4/2010 | Lee |
| 2010/0109002 A1* | 5/2010 | Itagaki et al. ............ 257/43 |
| 2010/0117073 A1 | 5/2010 | Yamazaki et al. |
| 2010/0120197 A1* | 5/2010 | Levy et al. ............ 438/104 |
| 2010/0140611 A1 | 6/2010 | Itagaki et al. |
| 2010/0166954 A1* | 7/2010 | Fidanza et al. ............ 427/245 |
| 2010/0193783 A1 | 8/2010 | Yamazaki et al. |
| 2010/0200848 A1* | 8/2010 | Arakane et al. ............ 257/40 |
| 2010/0252832 A1 | 10/2010 | Asano et al. |

FOREIGN PATENT DOCUMENTS

| | | |
|---|---|---|
| EP | 145403 A2 | 6/1985 |
| JP | 06-045354 A | 2/1994 |
| JP | 3958605 | 5/2007 |
| KR | 1999009046 | 3/1999 |
| KR | 2001-0011855 A | 2/2001 |
| KR | 2001051193 | 6/2001 |
| WO | WO 2008133345 A1 * | 11/2008 |
| WO | WO-2010/002803 | 1/2010 |

OTHER PUBLICATIONS

Ozgur, et al. "A comprehensive review of ZnO materials and devices," Journal of Applied Physics 98, 041301 (2005), American Institute of Physics.

Wang, et al. "Epitaxial growth of NH3-doped ZnO thin films on <0224> oriented sapphire substrates," Journal of Crystal Growth 255, Apr. 9, 2003, pp. 293-297.

Ye, et al. "Preparation and characteristics of p-type ZnO films by DC reactive magnetron sputtering," Journal of Crystal Growth 253, Feb. 4, 2003, pp. 258-264.

Korean Office Action dated Jul. 21, 2008 for Korean Application No. 10-2007-0066962.

Hiramatsu, et al. "Formation of TiN films with low CI concentration by pulsed plasma chemical vapor deposition," American Vacuum Society, vol. 14, No. 3, May/Jun. 1996, pp. 1037-1040.

Toyoura et al., "Optical properties of zinc nitride formed by molten salt electrochemical process", Thin Film Solids 492 (2005), pp. 88-92.

Ma et al., "Method of control of nitrogen content in ZnO films: Structural and photoluminescence properties", J. Vac. Sci. Technol. B 22(1), Jan./Feb. 2004, pp. 94-98.

Fortunato et al., "Wide-bandgap high-mobility ZnO thin-film transistors produced at room temperature", Applied Physics Letters, vol. 85, No. 13, Sep. 27, 2004, pp. 2541-2543.

Hoffman et al., "ZnO-based transparent thin-film transistors", Applied Physics Letters, vol. 82, No. 5, Feb. 3, 2003, pp. 733-735.

Zong et al., "Optical band gap of zinc nitride films prepared on quartz substrates from a zinc nitride target by reactive if magnetron sputtering", Applied Surface Science 252 (2006), pp. 7983-7986.

Bian et al., "Deposition and electrical properties of N-In codoped p-type ZnO films by ultrasonic spray pyrolysis", Applied Physics Letters, vol. 84, No. 4, Jan. 26, 2004, pp. 541-543.

Barnes et al., "On the formation and stability of p-type conductivity in nitrogen-doped zinc oxide", Applied Physics Letters, 86, 112112 (2005).

Hirao et al., "4.1: Distinguished Paper: High Mobility Top-Gate Zinc Oxide Thin-Film Transistors (ZnO-TFTs) for Active-Matrix Liquid Crystal Displays", SID 06 Digest (2006), pp. 18-20.

Hosano et al., "Working hypothesis to explore novel wide band gap electrically conducting amorphous oxides and examples", Journal of Non-Crystalline Solids, 198-200 (1996) pp. 165-169.

Park et al., "Highly Stable $Ga_2O_3$-$In_2O_3$-ZnO Thin-Film Transistors for AM-OLED Application", IDW '07, pp. 1775-1778.

Kwon et al., "4 inch QVGA AMOLED display driven by GaInZnO TFT", IDW '07, pp. 1783-1786.

Perkins et al., "Identification of nitrogen chemical states in N-doped ZnO via x-ray photoelectron spectroscopy", Journal of Applied Physics 97, 034907 (2005).

Yao et al., "Effects of nitrogen doping and illumination on lattice constants and conductivity behavior of zinc oxide grown by magnetron sputtering", Journal of Applied Physics 99, 123510 (2006).

Tu et al., "Nitrogen-doped p-type ZnO films prepared from nitrogen gas radio-frequency magnetron sputtering", Journal of Applied Physics 100, 053705 (2006).

Klaitabtim et al., "Growth and Characterization of Zinc Oxynitride Thin Films by Reactive Gas-Timing RF Magnetron Sputtering", Japanese Journal of Applied Physics, vol. 47, No. 1, 2008, pp. 653-656.

Lee et al., "42.2: World's Largest (15-inch) XGA AMLCD Panel Using IGZO Oxide TFT", SID 08 Digest, pp. 625-628.

Zong et al., "Structural properties of zinc nitride empty balls", Materials Letters 60 (2006), pp. 905-908.

Nomura et al., "Room-temperature fabrication of transparent flexible thin-film transistors using amorphous oxide semiconductors", Nature, vol. 432, Nov. 25, 2004, pp. 788-492.

Minami, Tadatsugu, "New n-Type Transparent Conducting Oxides", MRS Bulletin, Aug. 2000.

Zong et al., "Synthesis and thermal stability of $Zn_3N_2$ powder", Solid State Communications 132 (2004), pp. 521-525.

Kaminska et al., "Transparent p-type ZnO films obtained by oxidation of sputter-deposited $Zn_3N_2$", Solid State Communications, 135 (2005), pp. 11-15.

Son et al., "42.4L: Late-News Paper: 4 inch QVGA AMOLED Driven by the Threshold Voltage Controlled Amorphous GIZO ($Ga_2O_3$-$In_2O_3$-ZnO) TFT", SID 08 Digest, pp. 633-636.

Futushara et al., "Optical properties of zinc oxynitride thin films", Thin Film Solids, 317 (1998), pp. 322-325.

Futushara et al., "Structural, electrical and optical properties of zinc nitride thin films prepared by reactive rf magnetron sputtering", Thin Film Solids, 322 (1998), pp. 274-281.

Carcia et al., "Transparent ZnO thin-film transistor fabricated by rf magnetron sputtering", Applied Physics Letters, Col. 82, No. 7, Feb. 17, 2003, pp. 1117-1119.

Yan et al., "Control of Doping by Impurity Chemical Potentials: Predictions for p-type ZnO", Physical Review Letters, vol. 86, No. 25, Jun. 18, 2001, pp. 5723-5726.

Ohya et al., "Thin Film Transistor of ZnO Fabricated by Chemical Solution Deposition", Jpn. J. Appl. Phys., vol. 40 (2001), pp. 297-298.

Hossain, et al., "Modeling and simulation of polycrystalline ZnO thin-film transistors", Journal of Applied Physics, vol. 94, No. 12, Dec. 15, 2003, pp. 7768-7777.

Park et al., "Challenge to Future Displays: Transparent AM-OLED driven by PEALD grown ZnO TFT", IMID '07 Digest, pp. 1249-1252.

Hirao et al., "Bottom-Gate Zinc Oxide Thin-Film Transistors (ZnO TFTs) for AM-LCDs", IEEE Transactions on Electron Devices, Col. 55, No. 11, Nov. 2008, pp. 3136-3142.

Son et al., "Threshold Voltage Control of Amorphous Gallium Indium Zinc Oxide TFTs by Suppressing Back-Channel Current" Electrochemical and Solid-State Letters, 12 (1) H26-H28 (2009).

Futsuhara et al. "Optical properties of zinc oxynitride thin films," Thin Solid Films, vol. 317, 1998 Elsevier, pp. 322-325.

International Search Report and Written Opinion dated Aug. 8, 2008 for International Application No. PCT/US08/59638.

International Search Report and Written Opinion dated Oct. 8, 2008 for International Application No. PCT/US08/71890.

Tu et al. "Nitrogen-doped *p*-type ZnO films prepared from nitrogen gas radio-frequency magnetron sputtering," Journal of Applied Physics, vol. 100, Issue 5, 2006 American Institute of Physics, pp. 053705-053705-4.

Zong et al. "Optical band gap of zinc nitride films prepared on quartz substrates from a zinc nitride target by reactive rf magnetron sputtering," Applied Surface Science, vol. 252, Nov. 22, 2006, pp. 7983-7986.

Freeman et al., "Chemical and Thin-Film Strategies for New Transparent Conducting Oxides", MRS Bulletin, Aug. 2000, p. 45-51.

Jin et al., "Optical properties of transparent and heat reflecting ZnO:Al films made by reactive sputtering", Appl. Phys. Lett. 51 (3), Jul. 20, 1987, p. 149-151.

Pei et al., "Optical and electrical properties of direct-current magnetron sputtered ZnO:Al films", Journal of Applied Physics, vol. 90, No. 7, Oct. 1, 2001, p. 3432-3436.

Gordon, "Criteria for Choosing Transparent Conductors", MRS Bulletin, Aug. 2000, p. 52-57.

Barnes et al., "A comparison of plasma-activated N2/O2 and N2O/O2 mixtures for use in ZnO:N. synthesis by chemical vapor deposition", Journal of Applied Physics, vol. 96, No. 12 (Dec. 2004).

Zhao et al., "Growth of nitrogen-doped p-type ZnO films by spray pyrolysis and their electrical and optical properties", Journal of Crystal Growth, 280 (May 2005), 495-501.

Ye et al., "High mobility amorphous zinc oxynitride semiconductor material for thin film transistors", Journal of Applied Physics, 106, 074512 (2009).

Chiang et al., "High mobility transparent thin-film transistors with amorphous zinc tin oxide channel layer", Appl. Phys. Lett., 86, 013503 (2005).

Fortunato et al., "Wide-bandgap high-mobility ZnO thin-film transistors produced at room temperature", Applied Physics Letters, vol. 85, No. 13, 2541-2543.

Jackson et al., "High-performance flexible zinc tin oxide field-effect transistors", Applied Physics Letters, 87, 193503 (2005).

First Office Action for Chinese Patent Application No.: 200880015621.X, dated Nov. 24, 2010.

Wang et al., "Fabrication and characteristics of the low-resistive p-type ZnO thin films by DC reactive magnetron sputtering", Materials Letters, vol. 60, p. 912-914, Dec. 31, 2006.

Wang, "The optical and electrical characteristics and the microstructure of Al doped zinc oxide thin films", Dept. of Information material science and engineering Gullin, vol. 25(02), p. 19-22, Apr. 20, 2005.

Li, "The growth of high quality ZnO thin films at low temperature by PECVD & study of its properties", Chinese doctoral dissertations & master's theses full-text database (doctor) basic sciences, Journal 2nd, A005-11, Dec. 15, 2002.

Search report and written opinion for PCT/US2009/047966, dated Dec. 27, 2010.

Search report and written opinion for PCT/US2009/049092 dated Dec. 27, 2010.

European search report dated Jun. 30, 2010 for European Patent Application 08797025.7.

Barnes et al., "A comparison of plasma-activated N2/O2 and N2)/O2 mixtures for use in ZnO:N synthesis by chemical vapor deposition", Journal of Applied Physics, vol. 96, No. 12 (Dec. 2004).

Cao et al., "Low resistivity p-ZnO films fabricated by sol-gel spin coating", Applied Physics Letters, 88, 251116 (Jun. 2006).

Zhao et al., "Growth of nitrogen-doped p-type ZnO films by spray pyrolysis and their electrical and optical properties", Journal of Crystal Growth, 280 (May 2005), pp. 495-501.

Lu et al., "p-type conduction in N-Al co-doped ZnO thin films", Applied Physics Letters, vol. 85, No. 15, Oct. 2004, pp. 3134-3135.

Zhuge et al., "ZnO p-n homojunctions and ohmic contacts to Al-N-co-doped p-type ZnO", Applied Physics Letters, vol. 87, Aug. 2005.

Office Action for Chinese Patent Application No. 200880106291.5 dated Mar. 30, 2011.

International Search Report and Written Opinion for PCT/US2010/049239 dated May 4, 2011.

* cited by examiner

THIN FILM TRANSISTORS USING THIN FILM SEMICONDUCTOR MATERIALS

CROSS-REFERENCE TO RELATED APPLICATIONS

This application claims benefit of U.S. provisional patent application Ser. No. 60/953,683 (APPM/012581L), filed Aug. 2, 2007, which is herein incorporated by reference.

BACKGROUND OF THE INVENTION

1. Field of the Invention

Embodiments of the present invention generally relate to field effect transistors (FETs) and thin film transistors (TFTs) having semiconductor materials comprising oxygen, nitrogen, and one or more elements selected from the group consisting of zinc, gallium, cadmium, indium, and tin.

2. Description of the Related Art

Current interest in TFT arrays is particularly high because these devices may be used in liquid crystal active matrix displays (LCDs) of the kind often employed for computer and television flat panels. The LCDs may also contain light emitting diodes (LEDs) for back lighting. Further, organic light emitting diodes (OLEDs) have been used for active matrix displays, and these OLEDs require TFTs for addressing the activity of the displays.

TFTs made with amorphous silicon have become the key components of the flat panel display industry. Unfortunately amorphous silicon does have its limitations such as low mobility. The mobility required for OLEDs is at least 10 times higher than that achievable with amorphous silicon. The deposition temperature for amorphous silicon may be high, which can cause a Vth shift. A high current may be necessary for amorphous silicon, which can lead to stability issues in OLEDs. Polysilicon, on the other hand, has a higher mobility than amorphous silicon. Polysilicon is crystalline, which leads to non-uniform deposition. Due to the limitations of amorphous silicon, OLED advancement has been difficult.

In recent years, transparent TFTs have been created in which zinc oxide has been used as the active channel layer. Zinc oxide is a compound semiconductor that can be grown as a crystalline material at relatively low deposition temperatures on various substrates such as glass and plastic. Zinc oxide based TFTs may not degrade upon exposure to visible light. Therefore, a shield layer, as is necessary for silicon based TFTs, is not present. Without the shield layer, the TFT remains transparent. Zinc oxide, while having a mobility greater than amorphous silicon, still has a low mobility.

Therefore, there is a need in the art for TFTs having transparent active channels with high mobility.

SUMMARY OF THE INVENTION

The present invention generally comprises TFTs having semiconductor material comprising oxygen, nitrogen, and one or more element selected from the group consisting of zinc, tin, gallium, cadmium, and indium as the active channel. The semiconductor material may be used in bottom gate TFTs, top gate TFTs, and other types of TFTs. The TFTs may be patterned by etching to create both the channel and the metal electrodes. Then, the source-drain electrodes may be defined by dry etching using the semiconductor material as an etch stop layer. The active layer carrier concentration, mobility, and interface with other layers of the TFT can be tuned to predetermined values. The tuning may be accomplished by changing the nitrogen containing gas to oxygen containing gas flow ratio, annealing and/or plasma treating the deposited semiconductor film, or changing the concentration of aluminum doping.

In one embodiment, a TFT is disclosed. The transistor comprises a semiconductor layer comprising oxygen, nitrogen and one or more elements selected from the group consisting of zinc, indium, tin, cadmium, gallium, and combinations thereof. In another embodiment, a TFT fabrication method is disclosed. The method comprises depositing a semiconductor layer over a substrate, the semiconductor layer comprising oxygen, nitrogen and one or more elements selected from the group consisting of zinc, indium, tin, cadmium, gallium, and combinations thereof.

In another embodiment, a TFT fabrication method is disclosed. The method comprises depositing a semiconductor layer over a substrate, the semiconductor layer comprising oxygen, nitrogen and one or more elements selected from the group consisting of an element having filled s and d orbitals, an element having a filled f orbital, and combinations thereof. The method also includes depositing a source-drain electrode layer over the active channel layer, first etching the source-drain electrode layer and the active channel layer to create an active channel, and second etching the source-drain electrode layer to define source-drain electrodes.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally comprises TFTs having semiconductor material comprising oxygen, nitrogen, and
} one or more element selected from the group consisting of zinc, tin, gallium, cadmium, and indium as the active channel. The semiconductor material may be used in bottom gate TFTs, top gate TFTs, and other types of TFTs. The TFTs may be patterned by etching to create both the channel and the metal electrodes. Then, the source-drain electrodes may be defined by dry etching using the semiconductor material as an etch stop layer. The active layer carrier concentration, mobility, and interface with other layers of the TFT can be tuned to predetermined values. The tuning may be accomplished by changing the nitrogen containing gas to oxygen containing gas flow ratio, annealing and/or plasma treating the deposited semiconductor film, or changing the concentration of aluminum doping.

The semiconductor film comprising nitrogen, oxygen, and one or more elements selected from zinc, indium, gallium, cadmium, and tin may be deposited by reactive sputtering. The reactive sputtering method is illustratively described and may be practiced in a PVD chamber for processing large area substrates, such as a 4300 PVD chamber, available from AKT America, Inc., a subsidiary of Applied Materials, Inc., Santa Clara, Calif. However, because the semiconductor film produced according to the method may be determined by the film structure and composition, it should be understood that the reactive sputtering method may have utility in other system configurations, including those systems configured to process large area round substrates and those systems produced by other manufacturers, including roll-to-roll process platforms. It is to be understood that while the invention is illustratively described below as deposited by PVD, other methods including chemical vapor deposition (CVD), atomic layer deposition (ALD), or spin-on processes may be utilized to deposit the inventive films.

Figure 1:
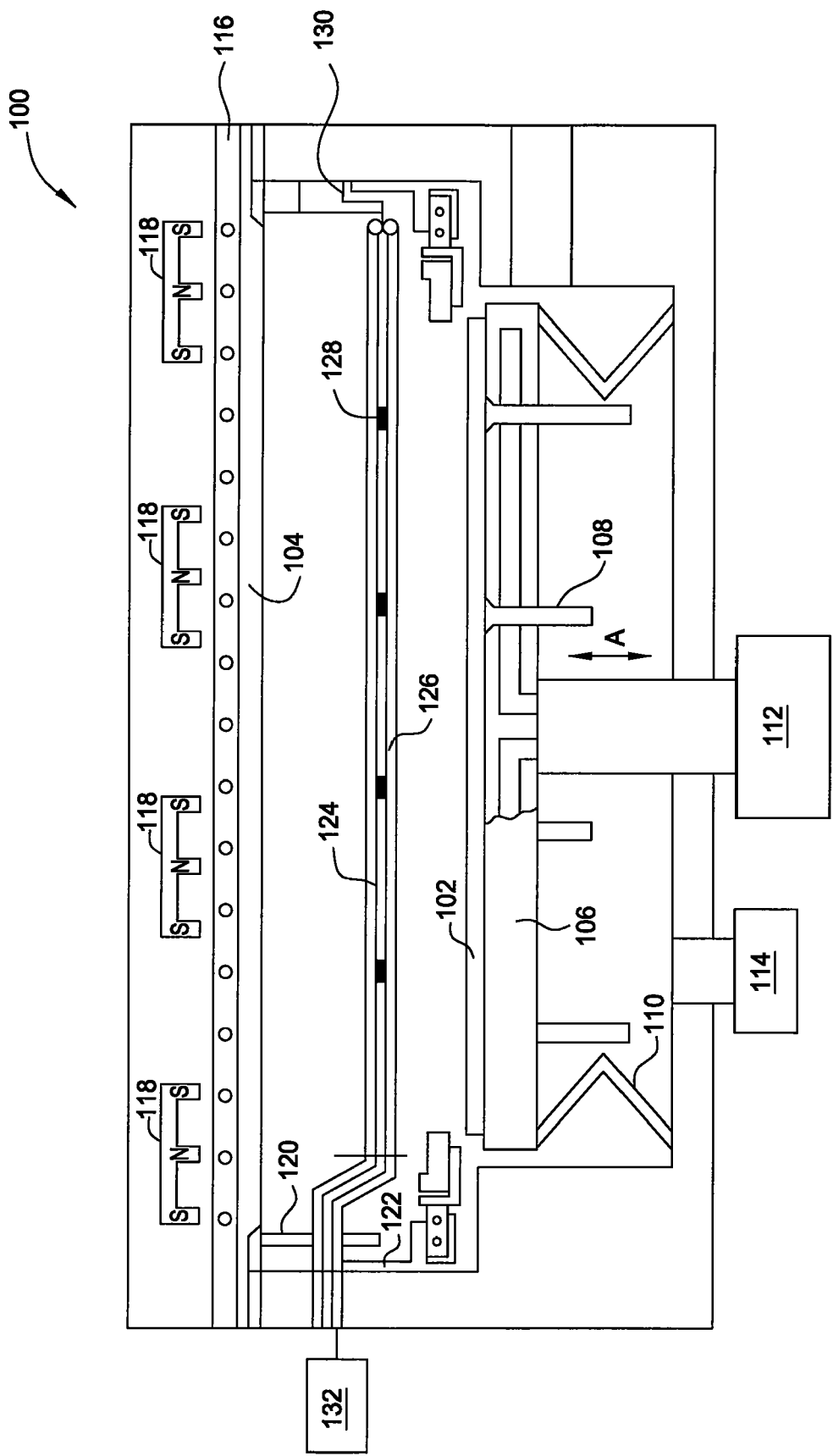
FIG. 1 is a schematic cross sectional view of a PVD chamber according to one embodiment of the invention.

FIG. 1 is a cross-sectional schematic view of a PVD chamber 100 according to one embodiment of the invention. The chamber 100 may be evacuated by a vacuum pump 114. Within the chamber 100, a substrate 102 may be disposed opposite a target 104. The substrate may be disposed on a susceptor 106 within the chamber 100. The susceptor 106 may be elevated and lowered as shown by arrows "A" by an actuator 112. The susceptor 106 may be elevated to raise the substrate 102 to a processing position and lowered so that the substrate 102 may be removed from the chamber 100. Lift pins 108 elevate the substrate 102 above the susceptor 106 when the susceptor 106 is in the lowered position. Grounding straps 110 may ground the susceptor 106 during processing. The susceptor 106 may be raised during processing to aid in uniform deposition.

The target 104 may comprise one or more targets 104. In one embodiment, the target 104 may comprise a large area sputtering target 104. In another embodiment, the target 104 may comprise a plurality of tiles. In yet another embodiment, the target 104 may comprise a plurality of target strips. In still another embodiment, the target 104 may comprise one or more cylindrical, rotary targets. The target 104 may be bonded to a backing plate 116 by a bonding layer (not shown). One or more magnetrons 118 may be disposed behind the backing plate 116. The magnetrons 118 may scan across the backing plate 116 in a linear movement or in a two dimensional path. The walls of the chamber may be shielded from deposition by a dark space shield 120 and a chamber shield 122.

To help provide uniform sputtering deposition across a substrate 102, an anode 124 may be placed between the target 104 and the substrate 102. In one embodiment, the anode 124 may be bead blasted stainless steel coated with arc sprayed aluminum. In one embodiment, one end of the anode 124 may be mounted to the chamber wall by a bracket 130. The anode 124 provides a charge in opposition to the target 104 so that charged ions will be attracted thereto rather than to the chamber walls which are typically at ground potential. By providing the anode 124 between the target 104 and the substrate 102, the plasma may be more uniform, which may aid in the deposition. To reduce flaking, a cooling fluid may be provided through the one or more anodes 124. By reducing the amount of expansion and contraction of the anodes 124, flaking of material from the anodes 124 may be reduced. For smaller substrates and hence, smaller processing chambers, the anodes 124 spanning the processing space may not be necessary as the chamber walls may be sufficient to provide a path to ground and a uniform plasma distribution.

For reactive sputtering, it may be beneficial to provide a reactive gas into the chamber 100. One or more gas introduction tubes 126 may also span the distance across the chamber 100 between the target 104 and the substrate 102. For smaller substrates and hence, smaller chambers, the gas introduction tubes 126 spanning the processing space may not be necessary as an even gas distribution may be possible through conventional gas introduction means. The gas introduction tubes 126 may introduce sputtering gases from a gas panel 132. The gas introduction tubes 126 may be coupled with the anodes 124 by one or more couplings 128. The coupling 128 may be made of thermally conductive material to permit the gas introduction tubes 126 to be conductively cooled. Additionally, the coupling 128 may be electrically conductive as well so that the gas introduction tubes 126 are grounded and function as anodes.

The reactive sputtering process may comprise disposing a metallic sputtering target opposite a substrate in a sputtering chamber. The metallic sputtering target may substantially comprise one or more elements selected from the group consisting of zinc, gallium, indium, tin, and cadmium. In one embodiment, the sputtering target may comprise one or more elements having a filled s orbital and a filled d orbital. In another embodiment, the sputtering target may comprise one or more elements having a filled f orbital. In another embodiment, the sputtering target may comprise one or more divalent elements. In another embodiment, the sputtering target may comprise one or more trivalent elements. In still another embodiment, the sputtering target may comprise one or more tetravalent elements.

The sputtering target may also comprise a dopant. Suitable dopants that may be used include Al, Sn, Ga, Ca, Si, Ti, Cu, Ge, In, Ni, Mn, Cr, V, Mg, $Si_xN_y$, $Al_xO_y$, and SiC. In one embodiment, the dopant comprises aluminum. In another embodiment, the dopant comprises tin. The substrate, on the other hand, may comprise plastic, paper, polymer, glass, stainless steel, and combinations thereof. When the substrate is plastic, the reactive sputtering may occur at temperatures below about 180 degrees Celsius. Examples of semiconductor films that may be deposited include $ZnO_xN_y$:Al, $ZnO_xN_y$:Sn, $SnO_xN_y$:Al, $InO_xN_y$:Al, $InO_xN_y$:Sn, $CdO_xN_y$:Al, $CdO_xN_y$:Sn, $GaO_xN_y$:Al, $GaO_xN_y$:Sn, $ZnSnO_xN_y$:Al $ZnInO_xN_y$:Al, $ZnInO_xN_y$:Sn, $ZnCdO_xN_y$:Al, $ZnCdO_xN_y$:Sn, $ZnGaO_xN_y$:Al, $ZnGaO_xN_y$:Sn, $SnInO_xN_y$:Al, $SnCdO_xN_y$:Al, $SnGaO_xN_y$:Al, $InCdO_xN_y$:Al, $InCdO_xN_y$:Sn, $InGaO_xN_y$:Al, $InGaO_xN_y$:Sn, $CdGaO_xN_y$:Al, $CdGaO_xN_y$:Sn, $ZnSnInO_xN_y$:Al, $ZnSnCdO_xN_y$:Al, $ZnSnGaO_xN_y$:Al, $ZnInCdO_xN_y$:Al, $ZnInCdO_xN_y$:Sn, $ZnInGaO_xN_y$:Al, $ZnInGaO_xN_y$:Sn, $ZnCdGaO_xN_y$:Al, $ZnCdGaO_xN_y$:Sn, $SnInCdO_xN_y$:Al, $SnInGaO_xN_y$:Al, $SnCdGaO_xN_y$:Al, $InCdGaO_xN_y$:Al, $InCdGaO_xN_y$:Sn, $ZnSnInCdO_xN_y$:Al, $ZnSnInGaO_xN_y$:Al, $ZnInCdGaO_xN_y$:Al, $ZnInCdGaO_xN_y$:Sn, and $SnInCdGaO_xN_y$:Al.

During the sputtering process, argon, a nitrogen containing gas, and an oxygen containing gas may be provided to the chamber for reactive sputtering the metallic target. Additional additives such as $B_2H_6$, $CO_2$, CO, $CH_4$, and combinations thereof may also be provided to the chamber during the sputtering. In one embodiment, the nitrogen containing gas comprises $N_2$. In another embodiment, the nitrogen containing gas comprises $N_2O$, $NH_3$, or combinations thereof. In one embodiment, the oxygen containing gas comprises $O_2$. In another embodiment, the oxygen containing gas comprises $N_2O$. The nitrogen of the nitrogen containing gas and the oxygen of the oxygen containing gas react with the metal from the sputtering target to form a semiconductor material comprising metal, oxygen, nitrogen, and optionally a dopant on the substrate. In one embodiment, the nitrogen containing gas and the oxygen containing gas are separate gases. In another embodiment, the nitrogen containing gas and the oxygen containing gas comprise the same gas.

The film deposited is a semiconductor film. Examples of semiconductor films that may be deposited include $ZnO_xN_y$, $SnO_xN_y$, $InO_xN_y$, $CdO_xN_y$, $GaO_xN_y$, $ZnSnO_xN_y$, $ZnInO_xN_y$, $ZnCdO_xN_y$, $ZnGaO_xN_y$, $SnInO_xN_y$, $SnCdO_xN_y$, $SnGaO_xN_y$, $InCdO_xN_y$, $InGaO_xN_y$, $CdGaO_xN_y$, $ZnSnInO_xN_y$, $ZnSnCdO_xN_y$, $ZnSnGaO_xN_y$, $ZnInCdO_xN_y$, $ZnInGaO_xN_y$, $ZnCdGaO_xN_y$, $SnInCdO_xN_y$, $SnInGaO_xN_y$, $SnCdGaO_xN_y$, $InCdGaO_xN_y$, $ZnSnInCdO_xN_y$, $ZnSnInGaO_xN_y$, $ZnInCdGaO_xN_y$, and $SnInCdGaO_xN_y$. Each of the aforementioned semiconductor films may be doped by a dopant.

The semiconductor film may comprise an oxynitride compound. In one embodiment, the semiconductor film comprises both a metal oxynitride compound as well as a metal nitride compound. In another embodiment, the semiconductor film may comprise a metal oxynitride compound, a metal nitride compound, and a metal oxide compound. In still another embodiment, the semiconductor film may comprise a metal oxynitride compound and a metal oxide compound. In another embodiment, the semiconductor film may comprise a metal nitride compound and a metal oxide compound.

The ratio of the nitrogen containing gas to the oxygen containing gas may affect the mobility, carrier concentration, and resistivity of the semiconductor film. Table I shows the effect of the nitrogen flow rate on the mobility, resistivity, and carrier concentration for a tin target sputtered in an atmosphere of argon and nitrogen gas. Generally, Table I shows that when the nitrogen flow rate increases, the mobility also increases. The argon and oxygen flow rates may remain the same. In Table I, the argon flow rate is 60 sccm and the oxygen flow rate is 5 sccm. The higher substrate temperature also provides an increase in mobility. The carrier concentration is weakly correlated with the mobility. The deposited film is an n-type semiconductor material which may function as an electron carrier and hence, the carrier concentration is shown as a negative number.

TABLE I

| $N_2$ Flow Rate (sccm) | Temperature (Celsius) | Mobility ($cm^2$/V-s) | Carrier Concentration (#/cc) | Resistivity (ohm-cm) |
|---|---|---|---|---|
| 0 | 150 | 0.3 | −1.00E+23 | 0.0005 |
| 50 | 150 | 0.2 | −6.00E+20 | 0.12 |
| 100 | 150 | 1.1 | −2.00E+15 | 7000 |
| 150 | 150 | 1.1 | −5.00E+19 | 0.12 |
| 200 | 150 | 3.7 | −8.00E+19 | 0.05 |
| 0 | 250 | 0.4 | −3.00E+18 | 10 |
| 50 | 250 | 0.2 | −3.00E+21 | 0.09 |
| 100 | 250 | 0.4 | −9.00E+17 | 90 |

TABLE I-continued

| $N_2$ Flow Rate (sccm) | Temperature (Celsius) | Mobility ($cm^2$/V-s) | Carrier Concentration (#/cc) | Resistivity (ohm-cm) |
|---|---|---|---|---|
| 150 | 250 | 1.8 | −3.00E+18 | 3 |
| 200 | 250 | 7.1 | 9.00E+19 | 0.01 |

The oxygen containing gas also affects the mobility, carrier concentration, and resistivity of the semiconductor film. Table II shows the effect of the oxygen flow rate on the mobility, resistivity, and carrier concentration for a tin target sputtered in an atmosphere of argon, nitrogen gas, and oxygen gas. The argon flow rate may remain the same. In Table II, the argon flow rate is 60 sccm. Generally, Table II shows that for high nitrogen gas to oxygen gas ratios, the mobility may be higher than the mobility for amorphous silicon. Additionally, the higher the ratio of nitrogen to oxygen, the lower the carrier concentration. At a 200 sccm nitrogen flow rate, the mobility increases as the oxygen flow rate increase, but then decreases at higher oxygen flow rates. In one embodiment, the mobility may be between about 4 $cm^2$/V-s and about 10 $cm^2$/V-s at a temperature of 150 degrees Celsius. The increase in mobility is not correlated to the carrier concentration. Thus, the mobility improvement may be a result of less scattering of the carrier. The mobility may be very low if no nitrogen additives are used. In such a scenario, the carrier concentration drops significantly as the oxygen gas flow increases. The higher the substrate temperature for a tin target, the better the mobility. In one embodiment, the pressure may be between about 5 mTorr to about 20 mTorr.

TABLE II

| $O_2$ Flow Rate (sccm) | $N_2$ Flow Rate (sccm) | Temperature (Celsius) | Mobility ($cm^2$/V-s) | Carrier Concentration (#/cc) | Resistivity (ohm-cm) |
|---|---|---|---|---|---|
| 5 | 0 | 150 | 0.1 | −2.00E+23 | 0.0005 |
| 10 | 0 | 150 | 0.2 | −2.00E+18 | 40 |
| 0 | 200 | 150 | 1.2 | −3.00E+19 | 0.03 |
| 5 | 200 | 150 | 4.2 | −9.00E+19 | 0.04 |
| 10 | 200 | 150 | 3.5 | −1.00E+20 | 0.05 |
| 0 | 200 | 250 | 0.2 | −3.00E+19 | 10 |
| 5 | 200 | 250 | 7.0 | −9.00E+19 | 0.01 |
| 10 | 200 | 250 | 9.5 | −9.00E+19 | 0.008 |

The amount of dopant may also affect the mobility of the deposited film. However, the mobility will still generally increase with an increase of nitrogen gas flow whether the target is doped or not. Table III shows the effect of dopant upon the mobility, carrier concentration, and resistivity. The dopant is shown in weight percentage. The argon flow rate may be the same for each deposited film. In Table III, the argon flow rate is 120 sccm. The carrier concentration when utilizing a dopant may be lower than in the scenario where no dopant is used. Thus, the dopant may be used to tune the carrier concentration.

TABLE III

| O₂ Flow Rate (sccm) | N₂ Flow Rate (sccm) | Percent Dopant (%) | Temperature (Celsius) | Mobility (cm²/V-s) | Carrier Concentration (#/cc) | Resistivity (ohm-cm) |
|---|---|---|---|---|---|---|
| 10 | 100 | 1 | 50 | 1  | −1.00E+21 | 0.009 |
| 10 | 200 | 1 | 50 | 14 | −4.00E+19 | 0.02 |
| 10 | 300 | 1 | 50 | 31 | −9.00E+18 | 0.04 |
| 10 | 400 | 1 | 50 | 34 | −5.00E+18 | 0.07 |
| 10 | 500 | 1 | 50 | 34 | −4.00E+18 | 0.09 |
| 20 | 100 | 0 | 50 | 2  | −1.00E+21 | 0.008 |
| 20 | 200 | 0 | 50 | 14 | −8.00E+19 | 0.009 |
| 20 | 300 | 0 | 50 | 29 | −2.00E+19 | 0.02 |
| 20 | 400 | 0 | 50 | 42 | −1.00E+19 | 0.03 |
| 20 | 500 | 0 | 50 | 45 | −8.00E+18 | 0.04 |
| 20 | 100 | 1 | 50 | 13 | −5.00E+19 | 0.03 |
| 20 | 200 | 1 | 50 | 27 | −3.00E+18 | 0.01 |
| 20 | 300 | 1 | 50 | 29 | −2.00E+18 | 0.01 |
| 20 | 400 | 1 | 50 | 29 | −2.00E+18 | 0.01 |
| 20 | 500 | 1 | 50 | 32 | −1.00E+18 | 0.03 |

Table IV discloses the effect of oxygen gas flow on the mobility, carrier concentration, and resistivity of the semiconductor film. Generally, under a fixed nitrogen gas flow, the mobility of the film will increase as the oxygen flow increases, but drop with a further increase in oxygen flow rate. The argon flow rate may be the same for each deposited film. In Table IV, the argon flow rate is 120 sccm. In one embodiment, the mobility of the film will decrease once the nitrogen containing gas to oxygen containing gas ratio is less than about 10:1. The increase in mobility does not relate to an increase in carrier concentration as the oxygen flow rate increases. When a dopant is used, the mobility and carrier concentration may be lowered. Thus, the carrier concentration and mobility may be tuned with the amount of dopant present.

TABLE IV

| O₂ Flow Rate (sccm) | N₂ Flow Rate (sccm) | Percent Dopant (%) | Temperature (Celsius) | Mobility (cm²/V-s) | Carrier Concentration (#/cc) | Resistivity (ohm-cm) |
|---|---|---|---|---|---|---|
| 0  | 300 | 1 | 50 | 0  | −3.00E+21 | 0.03 |
| 10 | 300 | 1 | 50 | 31 | −9.00E+18 | 0.04 |
| 30 | 300 | 1 | 50 | 23 | −9.00E+17 | 0.7 |
| 0  | 500 | 1 | 50 | 3  | −2.00E+19 | 0.02 |
| 10 | 500 | 1 | 50 | 33 | −5.00E+18 | 0.009 |
| 20 | 500 | 1 | 50 | 32 | −1.00E+18 | 0.2 |
| 30 | 500 | 1 | 50 | 25 | −5.00E+17 | 0.9 |
| 40 | 500 | 1 | 50 | 10 | −1.00E+16 | 10 |
| 10 | 300 | 0 | 50 | 4  | −2.00E+20 | 0.009 |
| 20 | 300 | 0 | 50 | 30 | −2.00E+19 | 0.01 |
| 30 | 300 | 0 | 50 | 43 | −1.00E+19 | 0.02 |
| 40 | 300 | 0 | 50 | 9  | −1.00E+16 | 80 |
| 10 | 500 | 0 | 50 | 23 | −9.00E+18 | 0.05 |
| 20 | 500 | 0 | 50 | 46 | −8.00E+19 | 0.04 |
| 30 | 500 | 0 | 50 | 47 | −7.00E+18 | 0.05 |
| 40 | 500 | 0 | 50 | 34 | −9.00E+17 | 0.3 |
| 50 | 500 | 0 | 50 | 15 | −4.00E+16 | 20 |

Table V shows the affect of the power density applied on the mobility, carrier concentration, and resistivity of the semiconductor film. Generally, the power density does not greatly affect the mobility, but the higher the power density, the higher the carrier concentration and resistivity. In one embodiment, the power density applied to the sputtering target may be between about 0.3 W/cm² and about 1.0 W/cm².

TABLE V

| O₂ Flow Rate (sccm) | N₂ Flow Rate (sccm) | Percent Dopant (%) | Power applied (W/cm²) | Temperature (Celsius) | Mobility (cm²/V-s) | Carrier Concentration (#/cc) | Resistivity (ohm-cm) |
|---|---|---|---|---|---|---|---|
| 0  | 500 | 2.8 | 0.47 | 50 | 13 | −8.00E+17 | 1 |
| 10 | 500 | 2.8 | 0.47 | 50 | 19 | −1.00E+18 | 0.03 |
| 20 | 500 | 2.8 | 0.47 | 50 | 30 | −8.00E+17 | 0.08 |
| 30 | 500 | 2.8 | 0.47 | 50 | 22 | −5.00E+15 | 95 |
| 0  | 500 | 2.8 | 0.7  | 50 | 3  | −1.00E+18 | 0.8 |
| 10 | 500 | 2.8 | 0.7  | 50 | 30 | −1.00E+18 | 0.3 |

TABLE V-continued

| $O_2$ Flow Rate (sccm) | $N_2$ Flow Rate (sccm) | Percent Dopant (%) | Power applied (W/cm$^2$) | Temperature (Celsius) | Mobility (cm$^2$/V-s) | Carrier Concentration (#/cc) | Resistivity (ohm-cm) |
|---|---|---|---|---|---|---|---|
| 20 | 500 | 2.8 | 0.7 | 50 | 29 | −2.00E+18 | 0.1 |
| 30 | 500 | 2.8 | 0.7 | 50 | 20 | −8.00E+17 | 0.9 |
| 40 | 500 | 2.8 | 0.7 | 50 | 4 | −2.00E+16 | 200 |

Table VI shows the effects of utilizing $N_2O$ as the oxygen containing gas in depositing the semiconductor film. The $N_2O$ gas is effective as an oxygen containing gas in raising the mobility of the semiconductor film and producing a reasonably low carrier concentration.

TABLE VI

| $N_2O$ Flow Rate (sccm) | $N_2$ Flow Rate (sccm) | Power applied (W/cm$^2$) | Temperature (Celsius) | Mobility (cm$^2$/V-s) | Carrier Concentration (#/cc) |
|---|---|---|---|---|---|
| 10 | 500 | 0.35 | 50 | 18 | −9.00E+18 |
| 20 | 500 | 0.35 | 50 | 42 | −9.00E+18 |
| 30 | 500 | 0.35 | 50 | 58 | −8.00E+18 |
| 40 | 500 | 0.35 | 50 | 57 | −7.00E+18 |
| 50 | 500 | 0.35 | 50 | 52 | −5.00E+18 |
| 60 | 500 | 0.35 | 50 | 40 | −2.00E+18 |
| 70 | 500 | 0.35 | 50 | 25 | −2.00E+17 |
| 10 | 500 | 0.35 | 180 | 95 | −1.00E+19 |
| 20 | 500 | 0.35 | 180 | 110 | −9.00E+18 |
| 30 | 500 | 0.35 | 180 | 75 | −5.00E+17 |
| 40 | 500 | 0.35 | 180 | 65 | −9.00E+17 |
| 50 | 500 | 0.35 | 180 | 55 | −5.00E+18 |
| 60 | 500 | 0.35 | 180 | 40 | −2.00E+18 |
| 70 | 500 | 0.35 | 180 | 25 | −6.00E+17 |

Table VII shows the chemical analysis for a semiconductor film that comprises tin, oxygen, and nitrogen and shows the effect of oxygen containing gas upon the film using X-ray photoelectron spectroscopy (XPS). Film 1 was deposited by sputtering a tin target for 360 seconds while a DC bias of 400 W was applied to the sputtering target. Argon was introduced to the processing chamber at a flow rate of 60 sccm, nitrogen was introduced at a flow rate of 200 sccm, and oxygen was introduced at a flow rate of 5 sccm. The deposition occurred at a temperature of 250 degrees Celsius. Film 1 had a carbon content of Film 1 was 22.5 atomic percent, a nitrogen content of 19.4 atomic percent, an oxygen content of 29.4 atomic percent, a fluorine content of 0.7 atomic percent, and a tin content of 28.1 atomic percent. Most, if not all, of the carbon could arise from adventitious carbon (i.e., carbon compounds adsorbed onto the surface of any sample exposed to the atmosphere). Film 2 was deposited by sputtering a tin target for 360 seconds while a DC bias of 400 W was applied to the sputtering target. Argon was introduced to the processing chamber at a flow rate of 60 sccm, nitrogen was introduced at a flow rate of 200 sccm, and oxygen was introduced at a flow rate of 20 sccm. The deposition occurred at a temperature of 250 degrees Celsius. Film 2 had a carbon content of 17.3 atomic percent, a nitrogen content of 4.5 atomic percent, an oxygen content of 49.9 atomic percent, a fluorine content of 0.6 percent, and a tin content of 27.7 atomic percent. Most, if not all, of the carbon could arise from adventitious carbon (i.e., carbon compounds adsorbed onto the surface of any sample exposed to the atmosphere). As shown in Table VII, as the oxygen flow rate (and hence, the ratio of oxygen to nitrogen) increases, the oxynitride content increases as well as does the tin oxide content. However, the tin nitride content and silicon oxynitride content is reduced. In Table VII, R equals oxygen or nitrogen.

TABLE VII

| | Film 1 | Film 2 | Beam Energy (eV) |
|---|---|---|---|
| Carbon Chemical State | | | |
| C—C, CH$_x$ | 76.0 | 73.7 | 285.0 |
| C—R | 12.6 | 12.0 | 286.4 |
| O═C | 2.8 | 4.4 | 287.9 |
| O═C—R | 8.6 | 10.0 | 289.1 |
| Nitrogen Chemical State | | | |
| Nitride | 79.0 | 56.2 | 396.9 |
| Oxynitride | 19.5 | 22.7 | 397.7 |
| Organic N | 1.3 | 10.4 | 399.1 |
| NH$^{4+}$ | 0.0 | 10.7 | 402.8 |
| Tin Chemical State | | | |
| Sn | 1.4 | 2.1 | 484.8 |
| SnO$_2$ | 71.9 | 84.4 | 486.4 |
| SnN$_x$, SnON | 26.7 | 13.4 | 487.3 |
| Oxygen Chemical State | | | |
| SnO$_x$ | 51.7 | 69.8 | 530.7 |
| Organic O | 48.3 | 30.2 | 532.1 |

Table VIII shows the results for several semiconductor films that were deposited by sputtering. The semiconductor films comprised zinc, tin, oxygen, and nitrogen. The semiconductor films were sputter deposited from a sputtering target having a zinc content of 70 atomic percent and a tin content of 30 atomic percent. The deposition occurred at a temperature of 250 degrees Celsius with a power of 400 W applied to the sputtering target. The deposition occurred for 360 seconds under an argon flow rate of 60 sccm and an oxygen flow rate of 20 sccm. The data shows that the mobility of the semiconductor film increases as the nitrogen flow rate (and hence, the ratio of nitrogen gas to oxygen gas) increases.

TABLE VIII

| Film | $N_2$ (sccm) | SEM Thickness (micrometers) | Rs | Mobility (cm$^2$/V-s) | Ns | N |
|---|---|---|---|---|---|---|
| 1 | 0.0 | 1.82 | 3.65E+05 | 0.0155 | −1.10E+15 | −6.06E+18 |
| 2 | 100.0 | 0.18 | 2.88E+07 | 1.1200 | 1.93E+11 | 1.05E+16 |
| 3 | 150.0 | 0.18 | 9.69E+03 | 4.7000 | −1.37E+14 | −7.44E+18 |
| 4 | 200.0 | 0.17 | 1.33E+03 | 14.0000 | −3.34E+14 | −1.93E+19 |

Zinc, Oxygen, and Nitrogen Compounds

In order to determine the desired oxygen flow rate for forming the semiconductor film comprising zinc, oxygen, and nitrogen, the amount of oxygen may be selected so that the amount of oxygen is not sufficient to completely oxidize the zinc to form zinc oxide. If the amount of oxygen containing gas supplied is too high, the mobility of the film may not be sufficient because the film may be too oxidized. The amount of oxidation of zinc may affect the transmittance. For example, completely oxidized zinc may have a transmittance of greater than about 80 percent. One manner of determining the desired oxygen flow is to run a reactive sputtering process using argon and oxygen gases without using nitrogen gas. Experiments may be performed at different oxygen flow rates and the optical transmittance in the visible wavelength may be measured. The desired oxygen flow may be just before the film has a maximum transparency that may be achieved. Table IX shows the optical transmittance for zinc oxide reactively sputter deposited at various oxygen flow rates. In one embodiment, the maximum preferred transmittance may be 80 percent. In other embodiments, the maximum transmittance may not be 80 percent if the glass absorption or light interference is included. The experiments may be useful when using different DC target power, different substrate temperature, or even different oxygen containing gases such as $N_2O$.

TABLE IX

| Oxygen Flow Rate ($sccm/m^3$) | Transmittance (%) |
|---|---|
| 0 | <5 |
| 50 | <5 |
| 100 | <5 |
| 125 | 82 |
| 150 | 85 |
| 200 | 90 |

Another method to determine the desired oxygen gas flow is to perform the reactive sputtering to form zinc oxide under the condition of providing no nitrogen or a low amount of nitrogen as discussed above and then measure the sheet resistance. An oxygen flow rate that produces a sheet resistance between about 100 ohm/sq and $1.0 \times 10^7$ ohm/sq may be the desired oxygen flow rate.

Yet another manner for determining the desired oxygen flow rate is to take an XRD film structure measurement. FIGS. 2A-2E are XRD graphs for films showing the formation of zinc and zinc oxide peaks as a function of oxygen gas flow. Each of the films shown in FIGS. 2A-2E were deposited at an argon flow rate of 600 $sccm/m^3$ and 1,000 W and various oxygen flow rates.

Figure 2A:
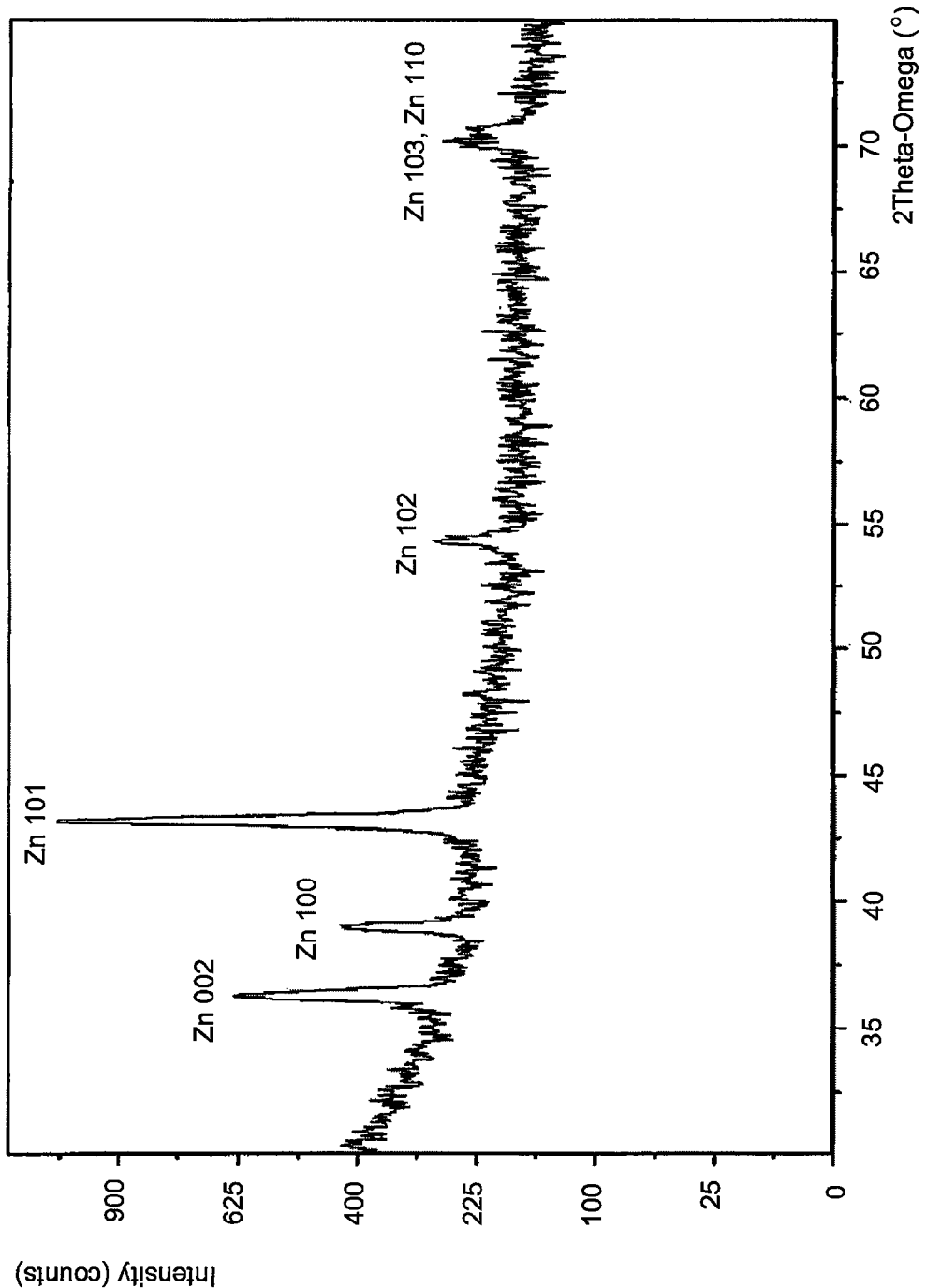
FIGS. 2A-2E are XRD graphs for films showing the formation of zinc and zinc oxide peaks as a function of oxygen gas flow.

FIG. 2A shows an XRD graph of a film formed when no oxygen gas is provided during the sputtering. Several zinc peaks were produced having various intensities. A zinc (002) peak is shown for 2 theta (i.e., the angle between the incident x-ray and the detector of the diffractometer) between about 35.5 and 37 with an intensity of about 625 counts. A zinc (100) peak is shown between about 38 and 40 with an intensity of about 450 counts. A zinc (101) peak is shown between about 42.5 and 44 with an intensity of about 1050 counts. A zinc (102) peak is shown between about 53 and 55 with an intensity of about 325 counts. A zinc (103) peak is shown between about 69.5 and 70 with an intensity of about 300 counts. A zinc peak (110) peak is shown between about 70 and 71 with an intensity of about 275 counts. The ratio of peak heights for the zinc (002):zinc (100):zinc (101):zinc (102):zinc (103):zinc (110) is about 2.27:1.64:3.82:1.182:1.091:1. All peaks are marked using the International Center for Diffraction Data (ICDD) PDF2 database (rev. 2004) for phase identification.

Figure 2B:
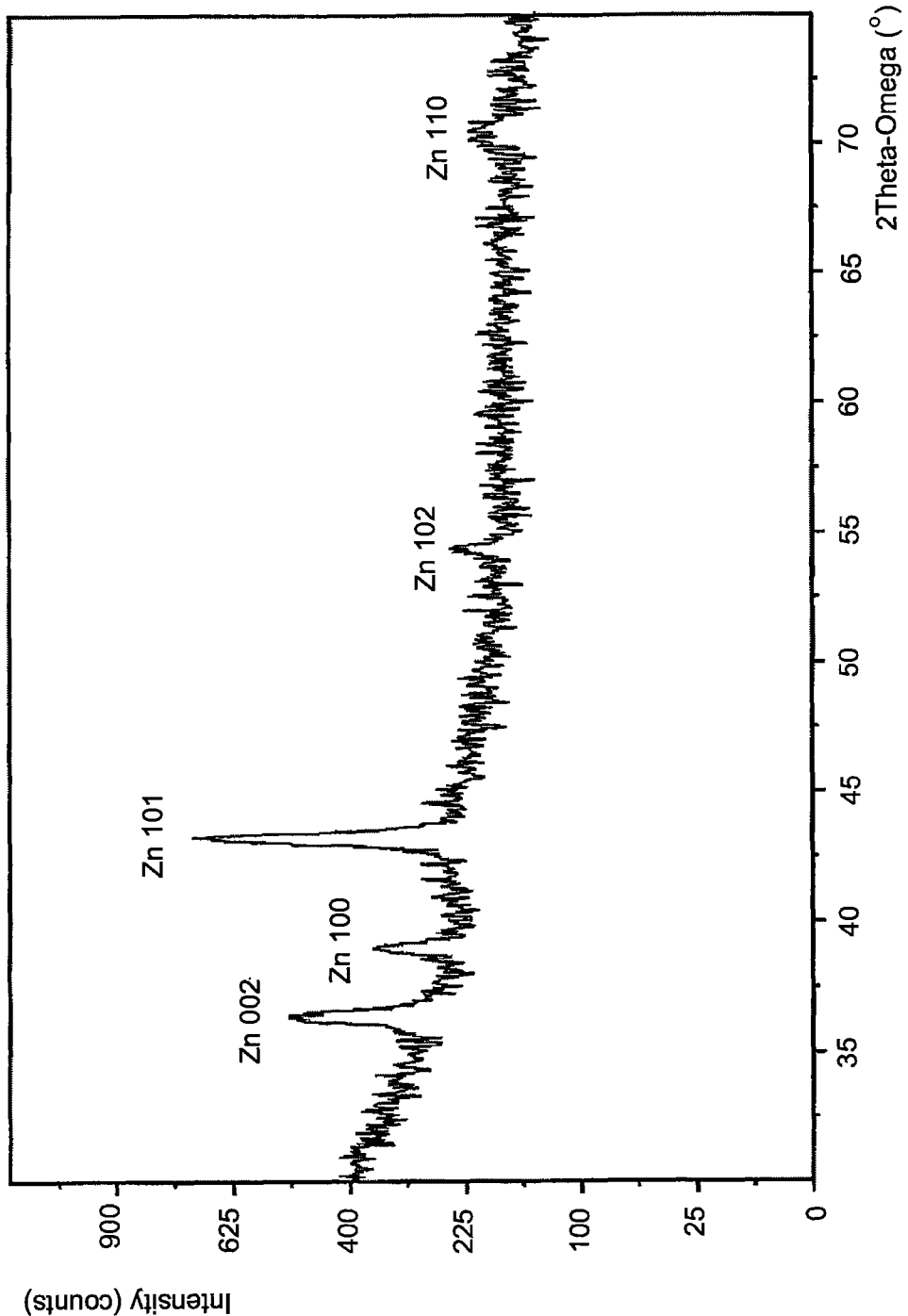

When oxygen gas is provided at a flow rate of 50 $sccm/m^3$, the zinc peaks diminish in intensity as shown in FIG. 2B. The zinc (002) peak diminishes to about 500 counts. The zinc (100) peak diminishes to about 375 counts. The zinc (101) peak diminishes to about 750 counts. The zinc (102) peak diminishes to about 250 counts. The zinc (110) peak diminishes to about 225 counts, and the zinc (103) peak is not present. The ratio of the peak heights for zinc (002):zinc (100):zinc (101):zinc (102):zinc (110) is about 2.22:1.67:3.33:1.11:1.

Figure 2C:
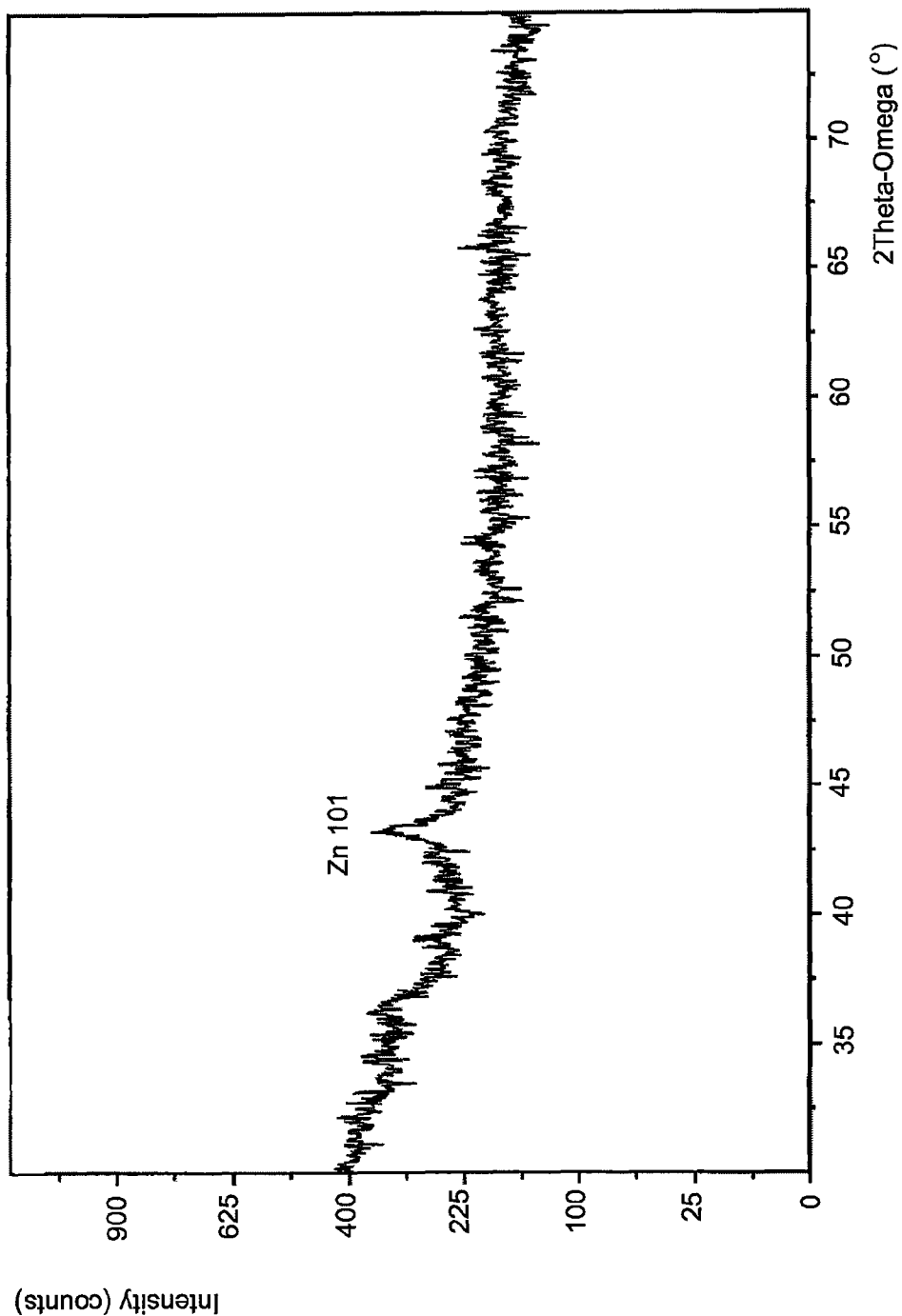
Figure 2D:
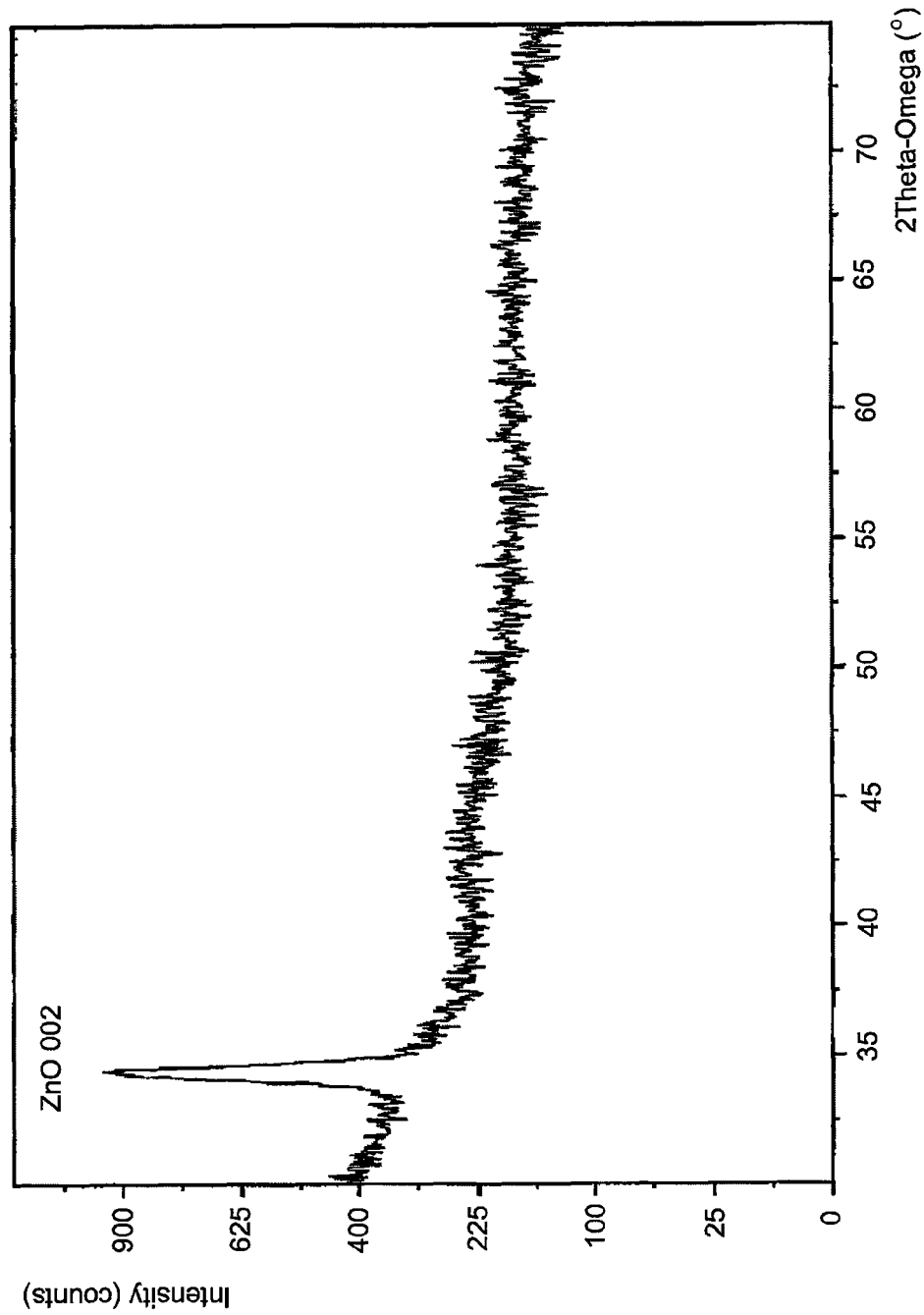
Figure 2E:
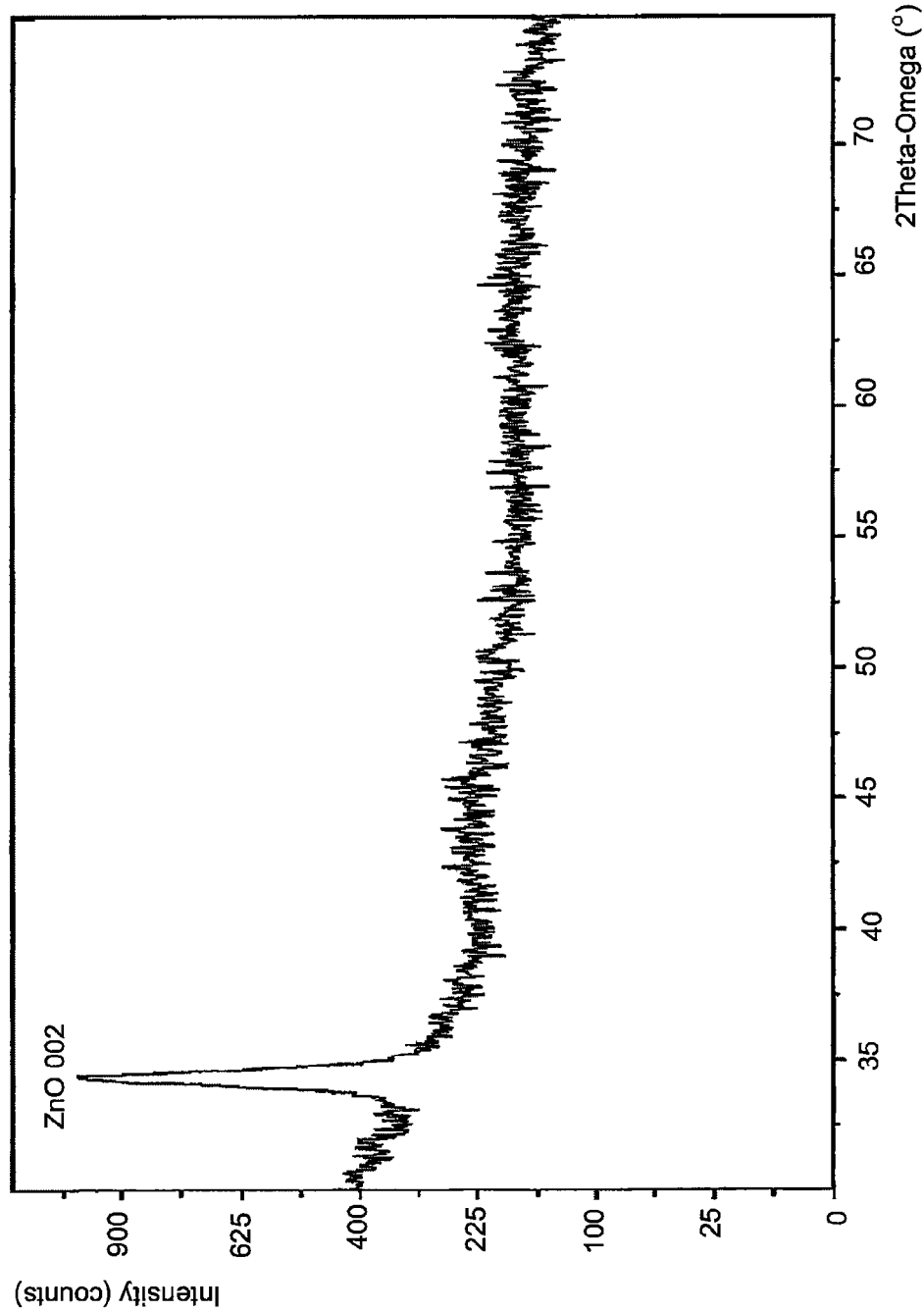

When the oxygen gas is provided at a flow rate of 100 $sccm/m^3$, all of the zinc peaks disappear except the zinc (101) peak which has diminished to about 375 counts as shown in FIG. 2C. When the oxygen gas is provided at 150 $sccm/m^3$, the zinc peaks are completely gone, but a zinc oxide (002) peak appears between about 33.5 and 35 with an intensity of about 950 counts as shown in FIG. 2D. When the oxygen flow rate is increased to 200 $sccm/m^3$, the zinc oxide (002) peak increases in intensity to about 1,000 counts as shown in FIG. 2E.

The amount of oxygen supplied, according to the XRD data, should be less than about 150 $sccm/m^3$ because at 150 $sccm/m^3$ a strong zinc oxide peak appears. It is to be understood that the flow rate of oxygen is proportional to the chamber size. Thus, for as the size of the chamber increases, the oxygen flow rate may also increase. Similarly, as the size of the chamber is reduced, the oxygen flow rate may decrease.

To determine the desired nitrogen flow rate, XRD film structure measurements may be taken. FIGS. 3A-3F are XRD graphs for showing the formation of a semiconductor film according at various nitrogen gas flow rates according to one embodiment of the invention. Each of the films shown in FIGS. 3A-3F were deposited at an argon flow rate of 600 $sccm/m^3$, 2,000 W, an oxygen flow rate of 100 $sccm/m^3$, and various nitrogen flow rates.

Figure 3A:
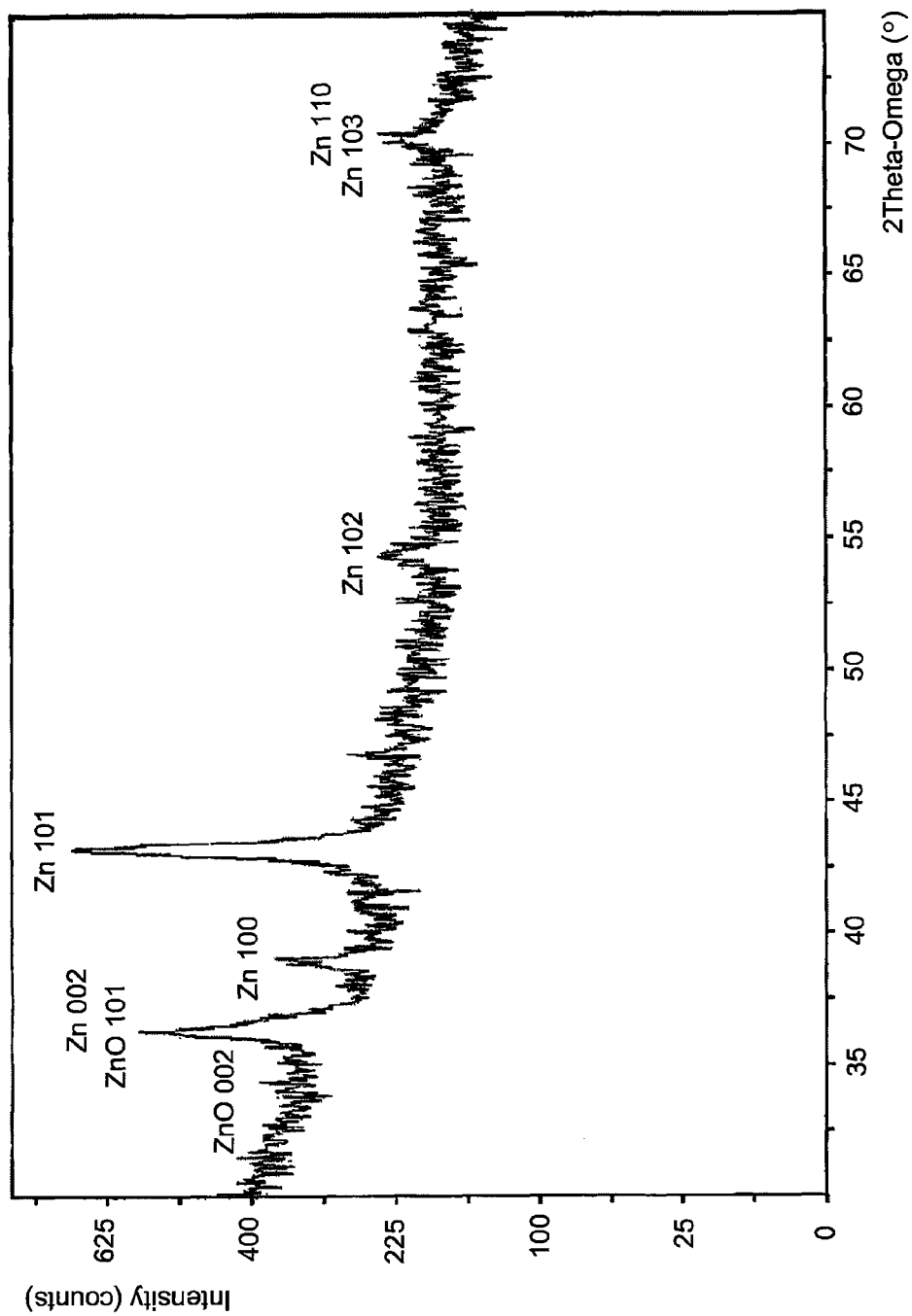
FIGS. 3A-3F are XRD graphs for showing the formation of a semiconductor film according at various nitrogen gas flow rates according to one embodiment of the invention.

FIG. 3A shows an XRD graph of a film deposited with no nitrogen. The graph reveals several strong peaks including a peak between about 35 and about 37 of zinc oxide (101) and zinc (002) having an intensity of about 575 counts, a peak between about 38 and 40 of zinc (100) having an intensity of about 380 counts, and a peak between about 42.5 and 44 of zinc (101) having an intensity of about 700 counts. Smaller peaks of zinc oxide (002) between about 35.5 and 37 with an intensity of about 390 counts, zinc (102) between about 53 and 55 with an intensity of about 275 counts, zinc (103) between about 69.5 and 70 with an intensity of about 225 counts, and a peak of zinc (110) between about 70 and 71 with an intensity of about 225 counts are also present. The ratio of the peak heights for zinc oxide (101):zinc (002):zinc (100):zinc (101):zinc oxide (002):zinc (102):zinc (103):zinc (110) is about 2.55:2.55:1.24:3.11:1.73:1.22:1:1.

Figure 3B:
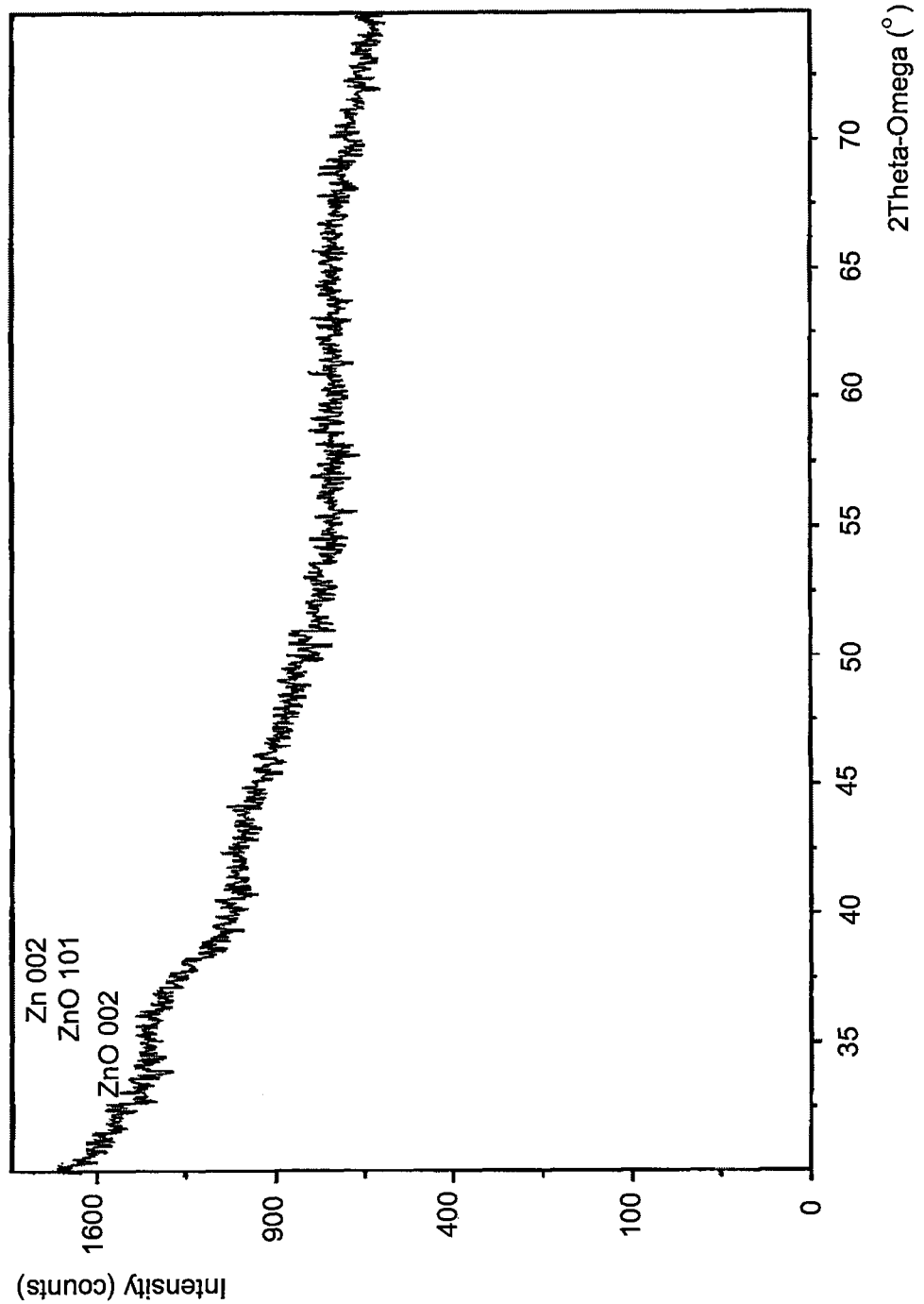
Figure 3C:
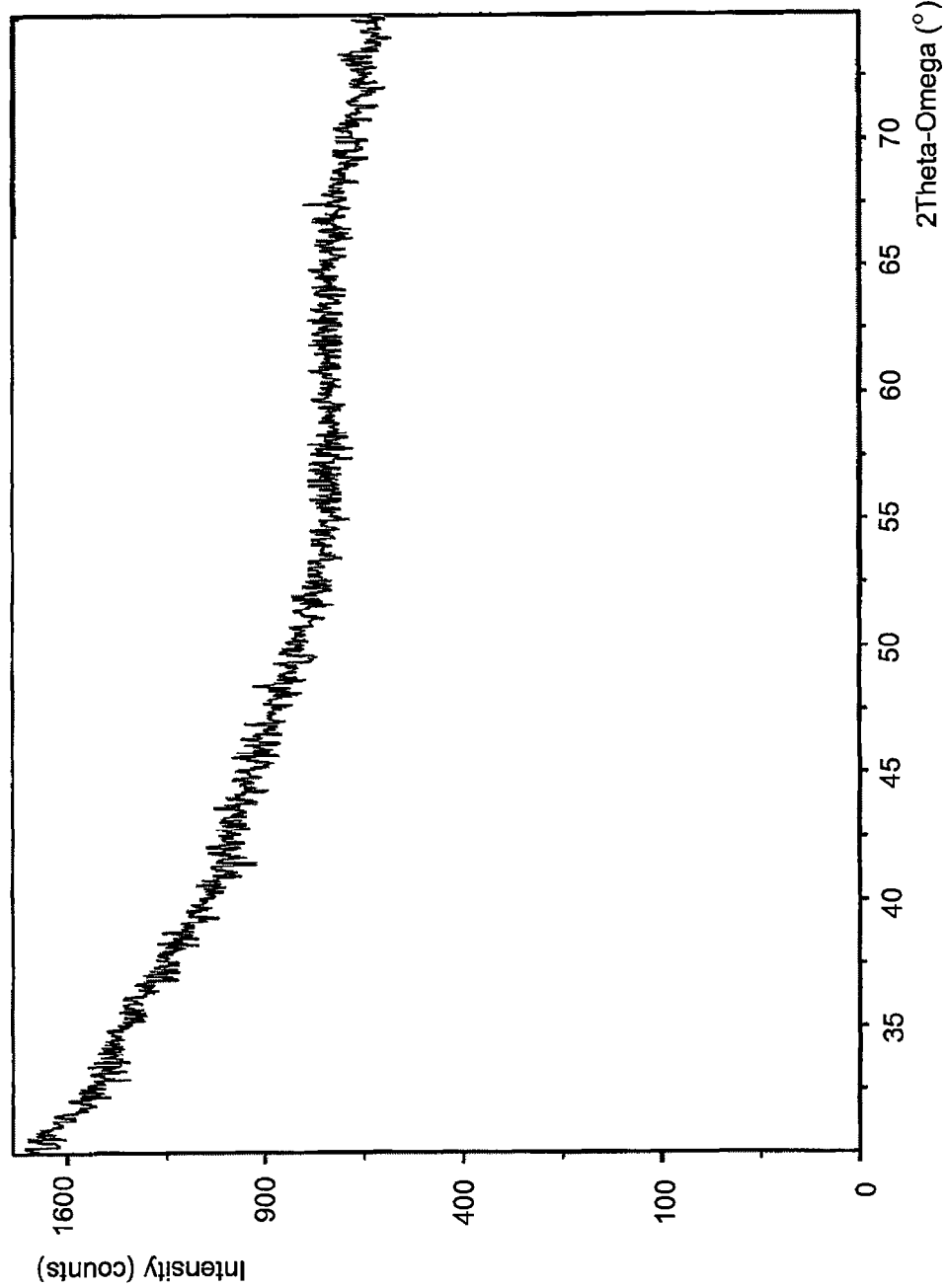

When nitrogen is provided during the reactive sputtering at a flow rate of 300 $sccm/m^3$, the zinc and zinc oxide peaks have significantly diminished to the point where zinc oxide may no longer be present as shown in FIG. 3B. When the nitrogen flow rate is increased to 500 $sccm/m^3$, all of the zinc and zinc oxide peaks have diminished and the film has an amorphous structure as shown in FIG. 3C.

Figure 3D:
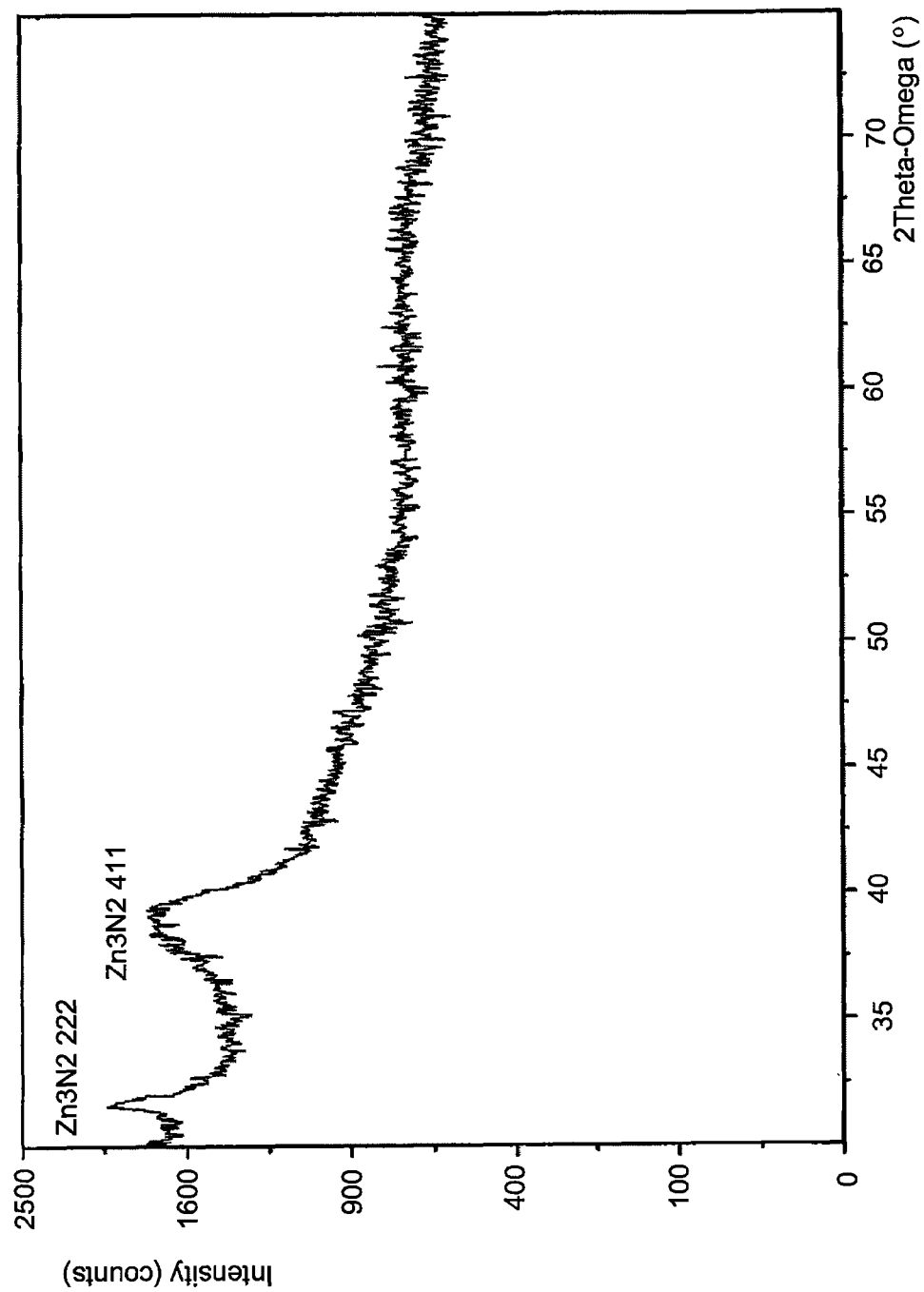
Figure 3E:
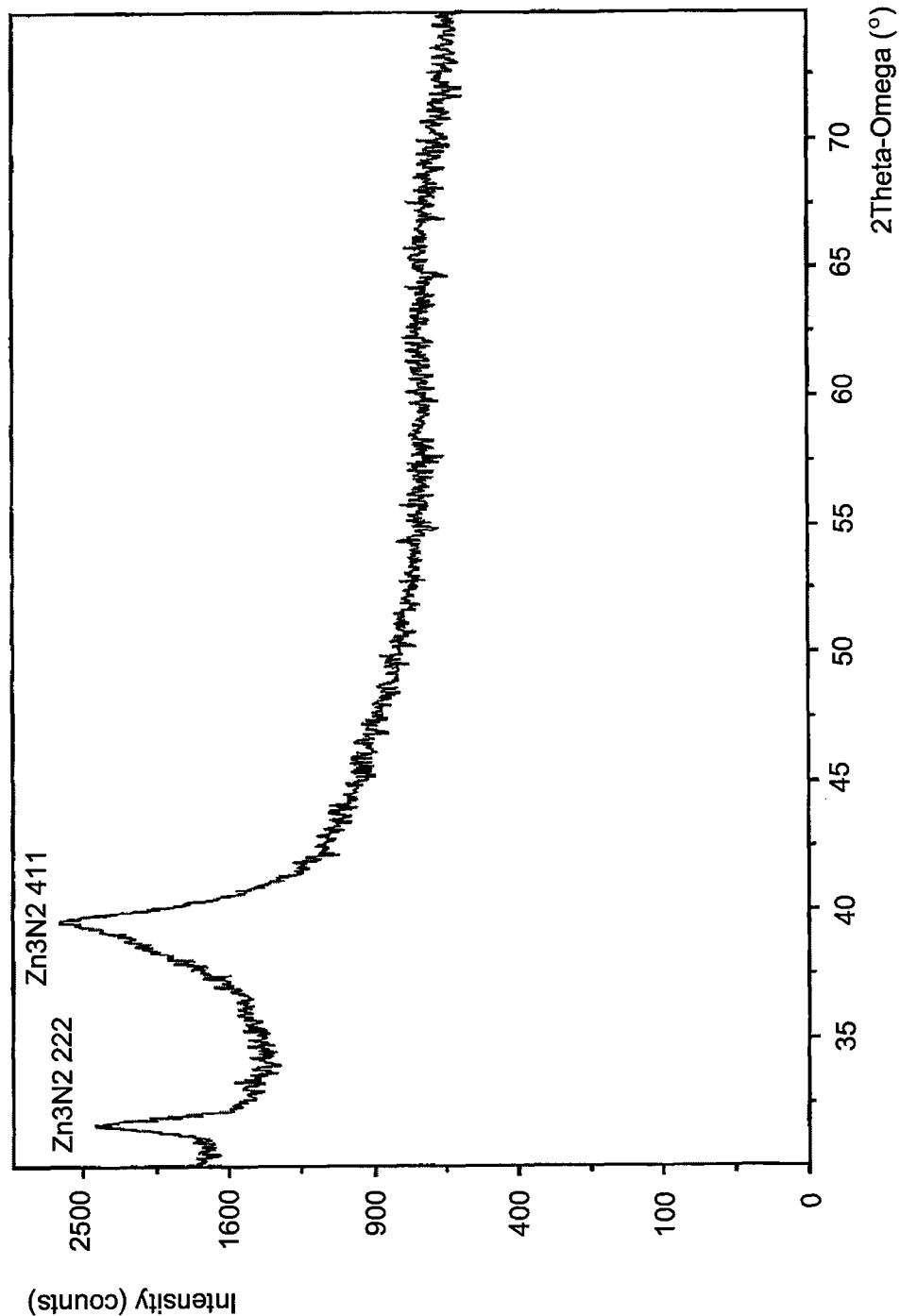
Figure 3F:
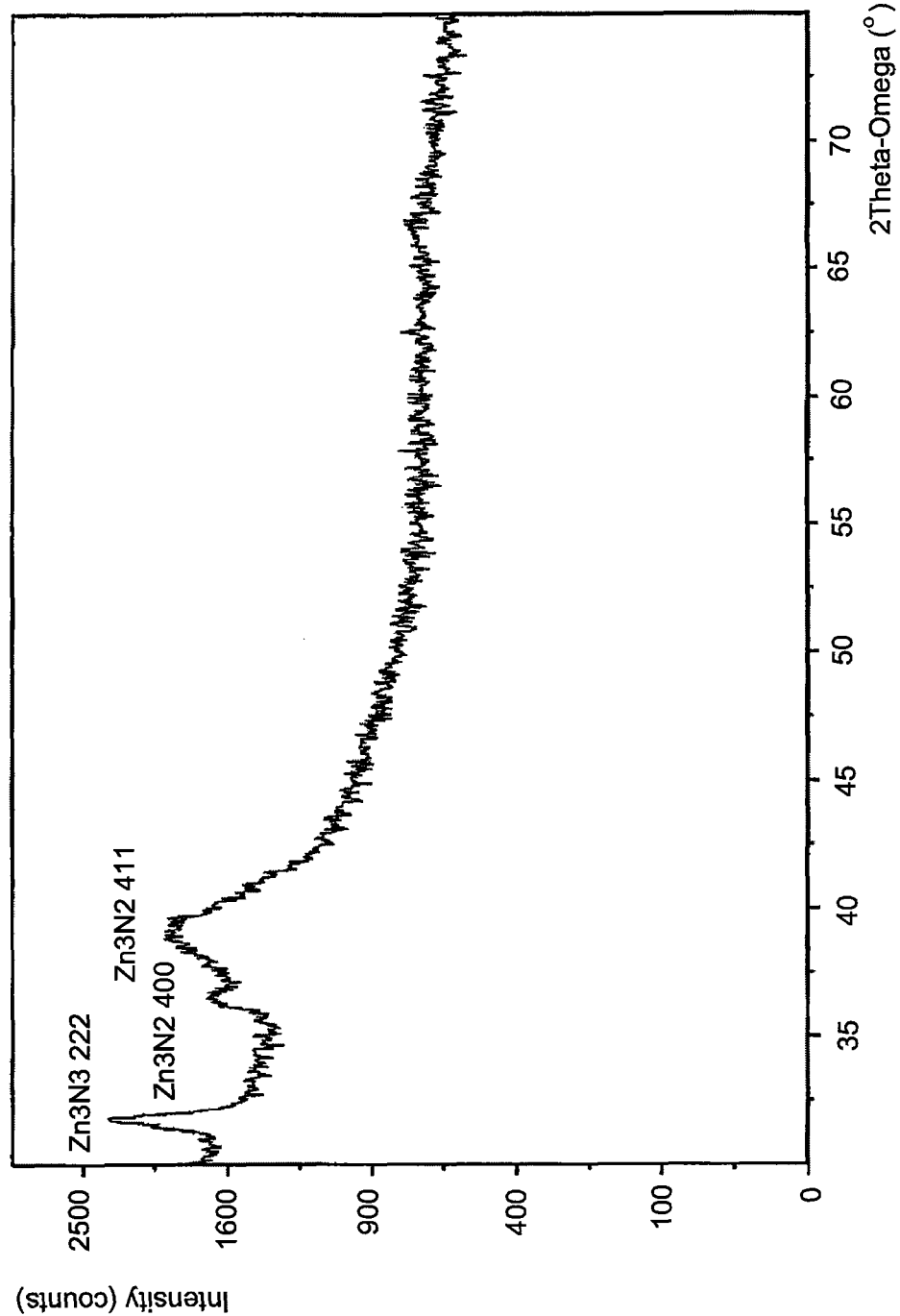

When the nitrogen flow rate is increased to 1,000 $sccm/m^3$, two new peaks appear as shown in FIG. 3D. A first peak of $Zn_3N_2$ (222) has formed between about 31 and 33 with an intensity of about 2050 counts. A second peak of $Zn_3N_2$ (411) has formed between about 35 and 42 with an intensity of about 1850 counts. The ratio of peak heights for $Zn_3N_2$ (222):

$Zn_3N_2$ (411) is about 1.11:1. When the nitrogen gas flow rate is increased to 1,250 sccm/m$^3$, the $Zn_3N_2$ (222) peak intensifies to about 2500 counts and the $Zn_3N_2$ (411) peak intensifies to about 2600 counts as shown in FIG. 3E. The ratio of peak heights for $Zn_3N_2$ (222):$Zn_3N_2$ (411) is about 0.96:1. When the nitrogen flow rate is increased to 2,500 sccm/m$^3$, the $Zn_3N_2$ (222) peak and the $Zn_3N_2$ (411) weaken to about 2350 and 2050 respectively, but a new peak of $Zn_3N_2$ (400) develops between about 36 and 37.5 with an intensity of about 1700 counts as shown in FIG. 3F. The ratio of peak heights for $Zn_3N_2$ (222):$Zn_3N_2$ (411):$Zn_3N_2$ (400) is about 1.38:1.21:1.

The amount of nitrogen supplied, according to the XRD data, should be greater than about 300 sccm/m$^3$ because at 300 sccm/m$^3$ the zinc oxide peaks diminish significantly such that essentially no zinc oxide is present in the film. It is to be understood that the flow rate of nitrogen is proportional to the chamber size. Thus, as the size of the chamber increases, the nitrogen flow rate may also increase. Similarly, as the size of the chamber is reduced, the nitrogen flow rate may decrease.

Therefore, combining the oxygen flow rates from above and the nitrogen flow rates from above, the new semiconductor film discussed herein may be deposited under a nitrogen to oxygen flow rate ratio of greater than about 2:1. In one embodiment, the flow ratio of nitrogen to oxygen may be 10:1 to about 50:1. In still another embodiment, the flow ratio of nitrogen to oxygen may be 20:1.

To produce the semiconductor material, the flow rate of the nitrogen containing gas may be much greater than the flow rate of the oxygen containing gas as discussed above. The deposited semiconductor material may have a mobility greater than amorphous silicon. Table X shows the mobility as a function of nitrogen gas flow rate according to one embodiment of the invention.

TABLE X

| Nitrogen Flow Rate (sccm/m$^3$) | Oxygen Flow Rate (sccm/m$^3$) | Mobility (cm$^2$/V-s) |
|---|---|---|
| 500 | 50 | 1 |
| | 100 | 13.5 |
| | 250 | 5 |
| 1,000 | 50 | 14 |
| | 100 | 27 |
| 1,500 | 0 | <1 |
| | 25 | 8 |
| | 50 | 31 |
| | 150 | 23.5 |
| | 200 | 1 |
| | 250 | 2 |
| 2,000 | 0 | 1 |
| | 50 | 34 |
| | 100 | 29 |
| 2,500 | 0 | 2.5 |
| | 25 | 15 |
| | 50 | 33.5 |
| | 100 | 33 |
| | 150 | 25 |
| | 200 | 10 |
| | 250 | 12 |

Films deposited under conditions of 0 sccm oxygen had mobility of less than 5 cm$^2$/V-s for all flow rates of nitrogen gas. Films deposited under conditions of 25 sccm/m$^3$ oxygen had a mobility of about 8 cm$^2$/V-s for a nitrogen flow rate of 1,500 sccm/m$^3$ and about 15 cm$^2$/V-s for a nitrogen flow rate of 2,500 sccm/m$^3$. Films deposited under conditions of 200 sccm/m$^3$ oxygen had a mobility of about 1 cm$^2$/V-s for a nitrogen flow rate of 1,500 sccm/m$^3$ and a mobility of about 10 cm$^2$/V-s for a nitrogen flow rate of 2,500 sccm/m$^3$. Films deposited under conditions of 250 sccm/m$^3$ oxygen has a mobility of about 5 cm$^2$/V-s for a nitrogen flow rate of 500 sccm/m$^3$, about 2 cm$^2$/V-s for a nitrogen flow rate of 1,500 sccm/m$^3$, and about 12 cm$^2$/V-s for a nitrogen flow rate of 2,500 sccm/m$^3$.

For films deposited with an oxygen flow rate of between 50 sccm/m$^3$ and 150 sccm/m$^3$, the mobility of the films was markedly increased over the films deposited at oxygen flow rates of 25 sccm/m$^3$ and below and films deposited at oxygen flow rates of 200 sccm/m$^3$ and above. Additionally, the films deposited with an oxygen flow rate of between 50 sccm/m$^3$ and 150 sccm/m$^3$ have mobilities far greater than amorphous silicon. At nitrogen flow rates of between 1,000 sccm/m$^3$ and 2,500 sccm/m$^3$, the mobility of the films were, in most cases, higher than 22 cm$^2$/V-s. When compared to amorphous silicon, which has a mobility of about 1 cm$^2$/V-s, the semiconductor films containing zinc, oxygen, and nitrogen have a significant improvement in mobility. Hence, nitrogen to oxygen gas flow ratios of about 10:1 to about 50:1 may produce semiconductor films having mobility greater than 20 times the mobility of amorphous silicon and 2 times the mobility of polysilicon. It is to be understood that while the table shows specific flow rates of nitrogen gas and oxygen gas, the flow rates of the oxygen gas and nitrogen gas are relative to the chamber size and thus, are scalable to account for different chamber sizes.

Table XI shows the sheet resistance, carrier concentration, and resistivity as a function of nitrogen gas flow rate according to one embodiment of the invention. For flow ratios of nitrogen gas to oxygen gas between about 10:1 to about 50:1, the sheet resistance of the semiconductor layer comprising zinc, oxygen, and nitrogen may be between about 100 ohm/sq and about 10,000 ohm/sq. With an increase in both nitrogen flow rate and oxygen flow rate, the electron carrier concentration lowers. Consequently, the resistivity increases.

TABLE XI

| Nitrogen Flow Rate (sccm/m$^3$) | Oxygen Flow Rate (sccm/m$^3$) | Sheet Resistance (ohm-cm) | Carrier Concentration (#/cc) | Resistivity (ohm-cm) |
|---|---|---|---|---|
| 500 | 50 | 400 | 1.00E+21 | 0.009 |
| | 100 | 800 | 5.00E+19 | 0.012 |
| 1,000 | 50 | 750 | 5.00E+19 | 0.012 |
| | 100 | 5000 | 4.00E+18 | 0.1 |
| 1,500 | 0 | 600 | 4.00E+21 | 0.014 |
| | 50 | 950 | 9.00E+18 | 0.014 |
| 2,000 | 0 | 1000 | 9.00E+20 | 0.014 |
| | 50 | 2000 | 5.00E+18 | 0.017 |
| | 100 | 9000 | 2.00E+18 | 0.1 |
| 2,500 | 0 | 6000 | 2.00E+19 | 0.11 |
| | 50 | 5000 | 4.00E+18 | 0.09 |
| | 100 | 9000 | 1.50E+18 | 0.12 |

Annealing may also significantly raise the mobility of the semiconductor film containing zinc, oxygen, and nitrogen. Table XII shows the mobility as a function of nitrogen gas flow rate after annealing according to one embodiment of the invention. After annealing, the mobility may be greater than 50 cm$^2$/V-s. In one embodiment, the mobility may be increased to greater than 90 cm$^2$/V-s by annealing. The annealing may occur for about five minutes in a nitrogen atmosphere at a temperature of about 400 degrees Celsius.

TABLE XII

| Nitrogen Flow Rate (sccm/m$^3$) | Oxygen Flow Rate (sccm/m$^3$) | Mobility (cm$^2$/V-s) |
|---|---|---|
| 500 | 0 | 1 |
|  | 50 | 13.5 |
|  | 100 | 5 |
| 1,000 | 0 | 28 |
|  | 50 | 48 |
|  | 100 | 15 |
| 1,250 | 0 | 29 |
|  | 100 | 20 |
| 1,500 | 50 | 94 |
| 2,000 | 50 | 92 |
| 2,500 | 0 | 50 |
|  | 50 | 65 |
|  | 100 | 21 |

The amount of dopant may also affect the mobility of the semiconductor film containing zinc, nitrogen, and oxygen. Tables XIII and XIV show the mobility, sheet resistance, carrier concentration, and resistivity for various nitrogen and oxygen flow rates when reactively sputtering a zinc sputtering target that is doped with aluminum. Thus, the amount of dopant in the sputtering target may be tuned to ensure a predetermined mobility, sheet resistance, carrier concentration, and resistivity are achieved.

TABLE XIII

| Percent Dopant | Oxygen Flow Rate (sccm) | Nitrogen Flow Rate (sccm) | Mobility (cm$^2$/V-s) | Sheet Resistance (ohm-cm) | Carrier Concentration (#/cc) | Resistivity (ohm-cm) |
|---|---|---|---|---|---|---|
| 0.0 | 20 | 100 | 3 | 100 | 1.00E+21 | 0.008 |
|  |  | 200 | 13 | 500 | 8.00E+19 | 0.009 |
|  |  | 300 | 28 | 600 | 2.00E+19 | 0.015 |
|  |  | 400 | 42 | 800 | 1.00E+19 | 0.020 |
|  |  | 500 | 45 | 950 | 9.00E+18 | 0.040 |
| 1.0 | 10 | 100 | 1 | 300 | 1.00E+21 | 0.009 |
|  |  | 200 | 14 | 600 | 5.00E+19 | 0.020 |
|  |  | 300 | 31 | 975 | 9.00E+18 | 0.040 |
|  |  | 400 | 33 | 2500 | 5.00E+18 | 0.080 |
|  |  | 500 | 33 | 5000 | 3.00E+18 | 0.090 |
| 1.0 | 20 | 100 | 14 | 800 | 8.00E+19 | 0.020 |
|  |  | 200 | 27 | 5000 | 4.00E+18 | 0.100 |
|  |  | 300 | 29.0 | 5,000 | 4.00E+18 | 0.100 |
|  |  | 400 | 29.0 | 9,000 | 2.00E+18 | 0.100 |
|  |  | 500 | 33.0 | 9,000 | 1.50E+18 | 0.200 |

TABLE XIV

| Percent Dopant | Nitrogen Flow Rate (sccm) | Oxygen Flow Rate (sccm) | Mobility (cm$^2$/V-s) | Sheet Resistance (ohm-cm) | Carrier Concentration (#/cc) | Resistivity (ohm-cm) |
|---|---|---|---|---|---|---|
| 0.0 | 300 | 0 | 0 | 100 | 1.00E+21 | 0.009 |
|  |  | 10 | 4 | 200 | 2.00E+20 | 0.009 |
|  |  | 20 | 30 | 500 | 2.00E+19 | 0.010 |
|  |  | 30 | 43 | 800 | 1.00E+19 | 0.020 |
|  |  | 40 | 9 | 4,000,000 | 1.00E+19 | 8.000 |
| 1.0 | 300 | 0 | 0 | 700 | 3.00E+21 | 0.030 |
|  |  | 10 | 31 | 950 | 9.00E+18 | 0.020 |
|  |  | 20 | 31 | 1,000 | 2.00E+18 | 0.040 |
|  |  | 30 | 23 | 1,200 | 9.00E+17 | 0.100 |
|  |  | 40 | 15 | 11,000 | 9.00E+17 | 0.700 |
| 1.0 | 500 | 0 | 2 | 8,000 | 2.00E+19 | 0.200 |
|  |  | 10 | 34 | 7,500 | 5.00E+18 | 0.090 |
|  |  | 20 | 33 | 9,000 | 1.50E+18 | 0.100 |
|  |  | 30 | 25 | 13,000 | 5.00E+17 | 0.700 |
|  |  | 40 | 15 | 13,000 | 5.00E+17 | 0.700 |

The temperature of the susceptor may also influence the mobility of the semiconductor film. Table XV shows the mobility, sheet resistance, carrier concentration, and resistivity for various nitrogen flow rates in sputtering a zinc sputtering target at temperatures of 30 degrees Celsius, 50 degrees Celsius, and 95 degrees Celsius. As may be seen from Table XV, the reactive sputtering may effectively form a semiconductor film having mobility higher than amorphous silicon and polysilicon at temperatures significantly below 400 degrees Celsius, including temperatures approaching room temperature. Thus, even without annealing, the semiconductor film may have a higher mobility than amorphous silicon.

TABLE XV

| Nitrogen Flow Rate (sccm/m$^3$) | Susceptor Temperature (Celsius) | Mobility (cm$^2$/V-s) | Sheet Resistance (ohm-cm) | Carrier Concentration (#/cc) | Resistivity (ohm-cm) |
|---|---|---|---|---|---|
| 500 | 30 | 1.0 | 200 | 1.00E+21 | 0.009 |
|  | 50 | 1.5 | 210 | 2.00E+19 | 0.008 |
|  | 95 | 2.0 | 300 | 4.00E+18 | 0.014 |
| 1,500 | 30 | 15.0 | 1,100 | 1.00E+21 | 0.030 |
|  | 50 | 31.0 | 950 | 9.00E+18 | 0.029 |
|  | 95 | 17.0 | 850 | 4.00E+18 | 0.028 |
| 2,500 | 30 | 28.0 | 3,100 | 7.00E+20 | 0.900 |
|  | 50 | 33.0 | 3,100 | 2.00E+19 | 0.078 |
|  | 95 | 32.0 | 2,950 | 4.00E+18 | 0.077 |

While the power may be described herein as specific values, it is to be understood that the power applied to the sputtering target is proportional to the area of the target. Hence, power values between about 10 W/cm$^2$ to about 100 W/cm$^2$ will generally achieve the desired results. Table XVI shows the affect of the applied DC power on the mobility, carrier concentration, and resistivity for nitrogen gas flows of 1,500 sccm/m$^3$ and 2,500 sccm/m$^3$. Power levels between about 1,000 W and 2,000 W produce semiconductor films having a mobility significantly higher than amorphous silicon.

TABLE XVI

| Nitrogen Flow Rate (sccm/m$^3$) | Power (W) | Mobility (cm$^2$/V-s) | Carrier Concentration (#/cc) | Resistivity (ohm-cm) |
|---|---|---|---|---|
| 1,500 | 1,000 | 34 | 5.00E+17 | 0.80 |
|  | 1,500 | 41 | 3.10E+18 | 0.08 |
|  | 2,000 | 31 | 7.20E+18 | 0.05 |
| 2,500 | 1,000 | 30 | 4.00E+17 | 2.00 |
|  | 1,500 | 39 | 1.50E+18 | 0.10 |
|  | 2,000 | 34 | 2.50E+18 | 0.09 |

The film deposited according to the above discussed deposition techniques may comprise a ternary compound semiconductor material having zinc, nitrogen, and oxygen such as $ZnN_xO_y$. In one embodiment, the ternary compound semiconductor material may be doped such as $ZnN_xO_y$:Al. The ternary semiconductor compound may have a high mobility and a low electron carrier density when deposited at room temperature in contrast to zinc oxide which has a high electron mobility and a high electron carrier density. In one embodiment, the ternary compound has a mobility higher than 30 cm$^2$/V-cm and an electron carrier density lower than 1.0e+19 #/cc. When the film is annealed at about 400 degrees Celsius, the mobility may be increased to greater than 100 cm$^2$/V-cm and the electron carrier density may be lower than 1.0e+18 #/cc without changing the film crystallographic orientation and composition. The high mobility and low electron density may be achieved for the ternary compound even when the film is an amorphous compound or poorly oriented crystallographic compound.

The optical band gap of the ternary compound may also be improved compared to zinc oxide. Zinc oxide typically has a band gap of about 3.2 eV. The ternary compound comprising zinc, nitrogen, and oxygen, on the other hand, may have a band gap from about 3.1 eV to about 1.2 eV. The band gap may be adjusted by altering the deposition parameters such as nitrogen to oxygen flow ratio, power density, pressure, annealing, and deposition temperature. Due to the lower band gap, the ternary compound may be useful for photovoltaic devices and other electronic devices. At very high processing temperatures such as 600 degrees Celsius, the ternary film may be converted to p-type or n-type semiconductor material. The annealing or plasma treatment may be fine tuned without fundamentally changing the compound structure and chemical composition. The fine tuning permits the properties of the compound to be tailored to meet the performance requirements of devices in which the compound may be used.

The ternary compound may be useful as a transparent semiconductor layer in a TFT device, a compound layer in a photovoltaic device or solar panel, or as a compound layer in a sensor device. FIGS. 4A-4G show a process sequence for forming a bottom gate TFT 400 according to one embodiment of the invention. The TFT may comprise a substrate 402. In one embodiment, the substrate 402 may comprise glass. In another embodiment, the substrate 402 may comprise a polymer. In another embodiment, the substrate may comprise plastic. In still another embodiment, the substrate may comprise metal.

Over the substrate, a gate electrode 404 may be formed. The gate electrode 404 may comprise an electrically conductive layer that controls the movement of charge carriers within the TFT. The gate electrode 404 may comprise a metal such as aluminum, tungsten, chromium, tantalum, or combinations thereof. The gate electrode 404 may be formed using conventional deposition techniques including sputtering, lithography, and etching. Over the gate electrode 404, a gate dielectric layer 406 may be deposited. The gate dielectric layer 406 may comprise silicon dioxide, silicon oxynitride, silicon nitride, or combinations thereof. The gate dielectric layer 406 may be deposited by well known deposition techniques including plasma enhanced chemical vapor deposition (PECVD).

Figure 4A:
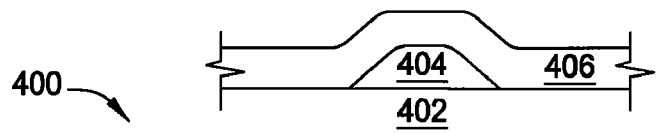
FIGS. 4A-4G show a process sequence for forming a bottom gate TFT according to one embodiment of the invention.
Figure 4B:
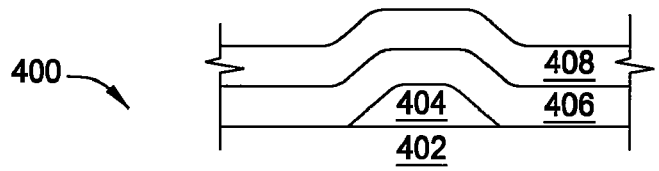
Figure 4C:
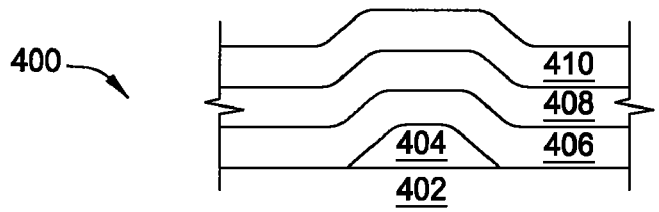

Over the gate dielectric layer 406, the active channel 408 (i.e., semiconductor layer) may be formed as shown in FIG. 4B. In one embodiment, the active channel 408 is annealed. In another embodiment, the active channel 408 is exposed to a plasma treatment. The annealing and/or plasma treatment may increase the mobility of the active channel 408. The active channel 408 may comprise the ternary compound having zinc, oxygen, and nitrogen as discussed above. In one embodiment, the ternary compound is doped with aluminum. Once the active channel 408 has been deposited, the source-drain layer 410 may be deposited over the active channel 408 as shown in FIG. 4C. In one embodiment, the source-drain layer 410 may comprise a metal such as aluminum, tungsten, molybdenum, chromium, tantalum, and combinations thereof. In order to define the active channel 408 and the source-drain electrodes, both the source-drain layer 410 and the active channel 408 may be etched.

Figure 4D:
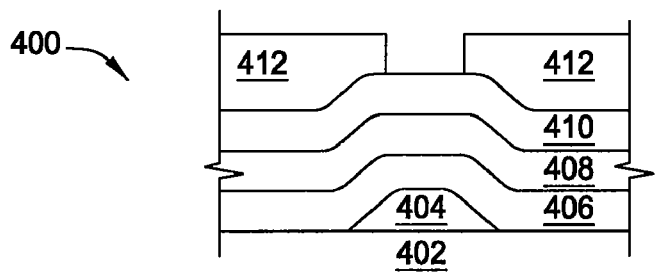

As shown in FIG. 4D, a mask 412 may be disposed on the source-drain layer 410. The mask 412 may have a predetermined pattern. The mask 412 may be disposed on the source-drain layer 410 by conventional techniques including photoresist deposition followed by pattern development.

Figure 4E:
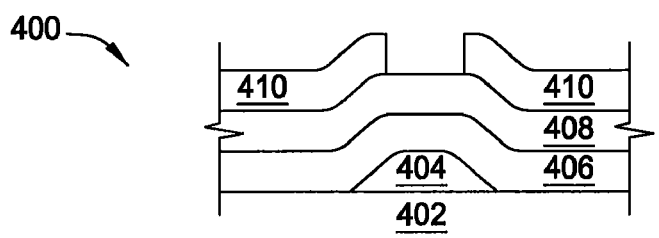
Figure 4F:
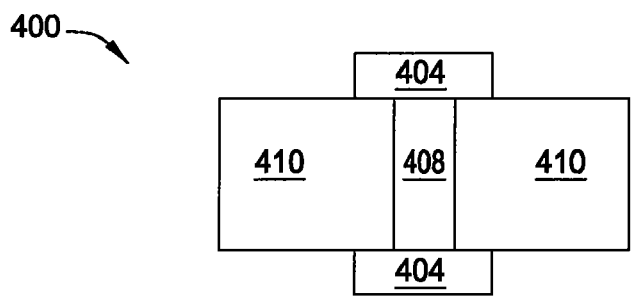

The active channel 408 and the source-drain layer 410 may be simultaneously etched as shown in FIG. 4E. FIG. 4F shows a top view of FIG. 4E. As can be seen in FIGS. 4E and 4F, the active channel 408 may be exposed by the etching. In one embodiment, the active channel 408 may be exposed by wet etching both the source-drain layer 410 and a portion of the active channel 408. In another embodiment, the source-drain layer 410 may be dry etched followed by a wet etching of a portion of the active channel 408. In another embodiment, the source-drain layer 410 may be etched without etching the active channel 408. In one embodiment, the dry etching may be performed with a gas containing an element selected from chlorine, oxygen, fluorine, or combinations thereof.

Figure 4G:
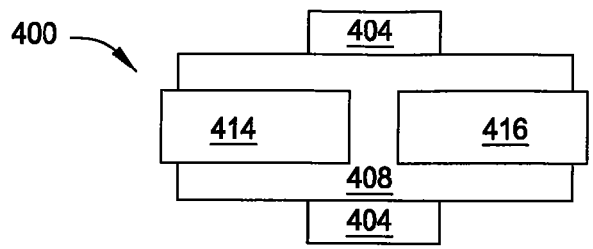

Following the exposure of the active channel 408, source-drain electrodes may be defined by dry etching the source-drain layer 410 using the active channel 408 as an etch stop layer. FIG. 4G shows a top view of the exposed active channel 408 and defined source electrode 414 and drain electrode 416. The active channel 408 may function as an etch stop layer during dry plasma etching because the ternary compound comprising zinc, oxygen, and nitrogen (and in certain embodiments, aluminum) may not be effectively etched by plasma.

Figure 5:
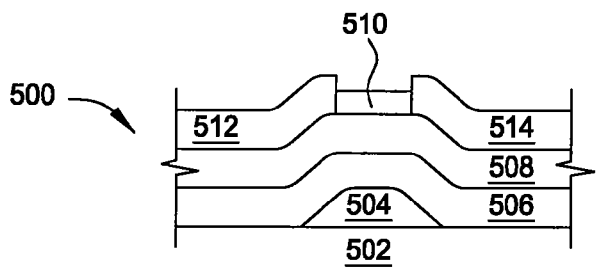
FIG. 5 is a schematic cross sectional view of an etch stop TFT according to one embodiment of the invention.

FIG. 5 is a schematic cross sectional view of an etch stop TFT 500 according to one embodiment of the invention. The etch stop TFT may comprise a substrate 502, a gate electrode 504, and a gate dielectric layer 506. The etch stop TFT 500 is similar to the bottom gate TFT shown above in FIGS. 4A-4G, but an etch stop 510 may be present over the active channel 508 between the source electrode 512 and the drain electrode 514. The materials for the substrate 502, gate electrode 504, gate dielectric 506, active channel 508, source electrode 512, and drain electrode 514 may be as described above in relation to the bottom gate TFT. The etch stop 510 may comprise a dielectric material comprising silicon and one or more of oxygen and nitrogen.

Figure 6:
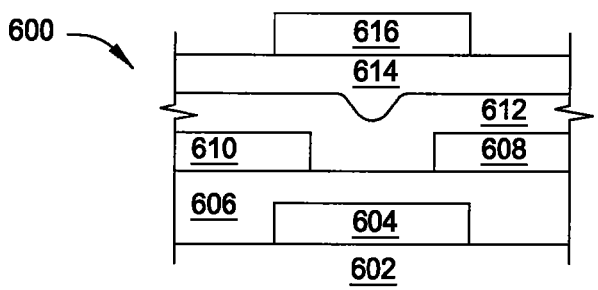
FIG. 6 is a schematic cross sectional view of a top gate TFT according to one embodiment of the invention.

FIG. 6 is a schematic cross sectional view of a top gate TFT 600 according to one embodiment of the invention. The top gate TFT 600 may comprise a substrate 602 having a light shielding layer 604 deposited thereon. A dielectric layer 606 may be deposited over the light shielding layer 604. A source electrode 608 and a drain electrode 610 may be deposited over the dielectric layer 606. The active channel layer 612 may be deposited over the source electrode 608 and the drain electrode 610. A gate dielectric layer 614 may be deposited over the active channel 612 and the gate electrode 616 may be deposited over the gate dielectric layer 614. The materials for the substrate 602, gate electrode 616, gate dielectric 614, active channel 612, source electrode 608, and drain electrode 610 may be as described above in relation to the bottom gate TFT. In forming the top gate TFT 600, the channel and electrode contact area may be formed by wet etching or dry etching followed by wet etching. Then, the contact area may be defined by dry etching using the active channel as an etch stop layer.

Figure 7:
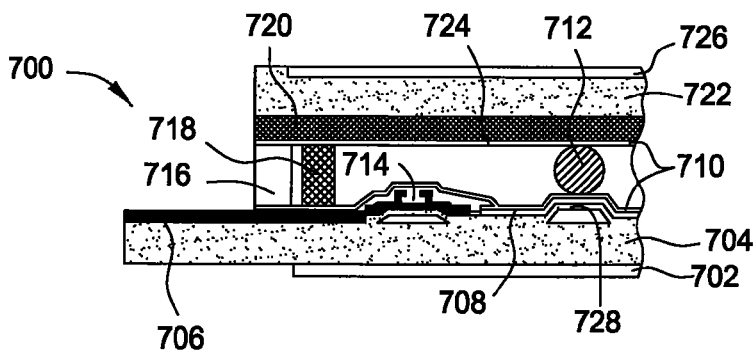
FIG. 7 is a schematic view of an active-matrix LCD according to one embodiment of the invention.

FIG. 7 is a schematic view of an active-matrix LCD 700 according to one embodiment of the invention. FIG. 7 shows a TFT substrate and a color filter substrate with a liquid crystal material sandwiched therebetween. The TFT controls a current to the pixel electrode creating an electric field to control the orientation of the liquid crystal material and thus the amount of light that is transmitted through the color filter. The TFTs are arranged in a matrix on a glass substrate. To address a particular pixel, the proper row is switched on, and then a charge is sent down the correct column. Since all of the other rows that the column intersects are turned off, only the capacitor at the designated pixel receives a charge. The capacitor is able to hold the charge until the next refresh cycle. If the amount of voltage supplied to a crystal is controlled, the crystal may untwist only enough to allow some light through.

The active matrix LCD 700 shown in FIG. 7 may be controlled by a TFT 714. The TFT 714 may turn pixels on or off. The LCD 700 may comprise a bonding pad 706, a pixel electrode 708, a storage capacitor 728, a polarizer 702, a substrate 704, an alignment layer 710, a spacer 712, a short 716, a seal 718, a black matrix 720, a color filter 724, and a common electrode 724.

Figure 8:
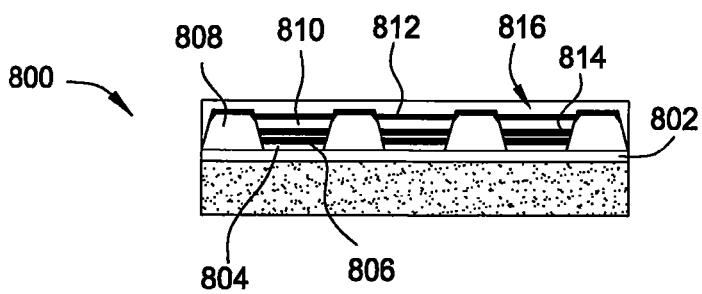
FIG. 8 is a schematic view of an active-matrix OLED according to one embodiment of the invention.

FIG. 8 is a schematic view of an active-matrix OLED 800 according to one embodiment of the invention. FIG. 8 shows a TFT controlling the amount of current applied to the emissive organic layers of the OLED. Active-matrix OLEDs have full layers of cathode, organic molecules and anode, but the anode layer overlays a TFT array that forms a matrix. The TFT array itself is the circuitry that determines which pixels get turned on to form an image. Active-matrix OLEDs consume less power than passive-matrix OLEDs because the TFT array requires less power than external circuitry, so they are efficient for large displays. Active-matrix OLEDs also have faster refresh rates suitable for video. Active-matrix OLEDs may be used in computer monitors, large screen TVs, electronic signs, and electronic billboards.

The OLED 800 may be controlled by a TFT 802 that turns the pixels on or off. The OLED 800 comprises a TFT 802, an anode 804, a hole injection layer 806, an ionization layer 808, a buffer layer 810, a transparent cathode 812, an emissive layer 814, and an encapsulation layer 816.

Figure 9C:
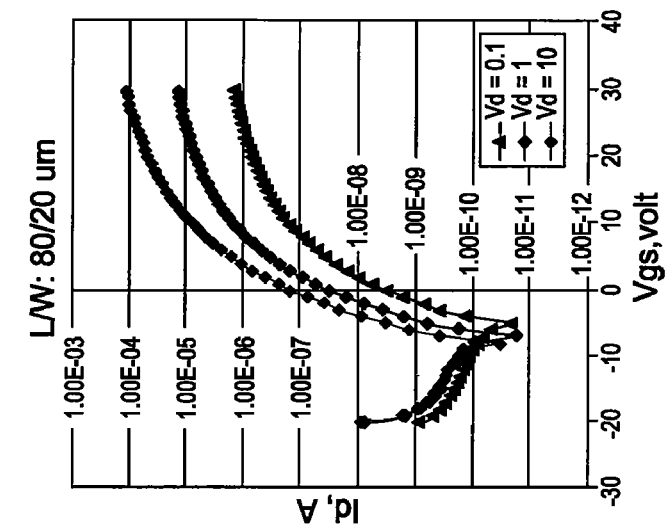
FIGS. 9A-9C show the Vth for various active channel lengths and widths.
Figure 9B:
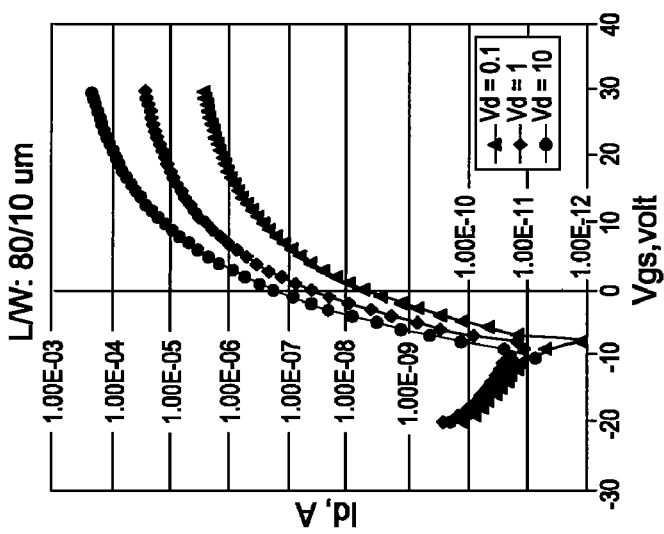
Figure 9A:
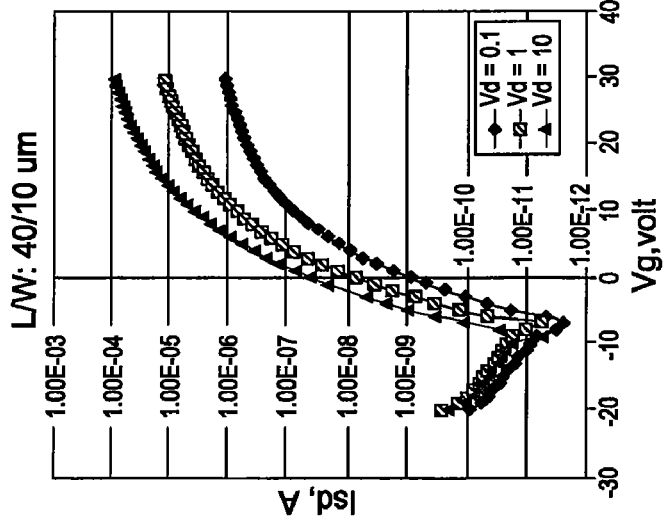

FIGS. 9A-9C show the Vth for various active channel lengths and widths. FIG. 9A shows the Vth for a active channel length of 40 µm and a width of 10 µm. FIG. 9B shows the Vth for a active channel length of 80 µm and a width of 10 µm. FIG. 9C shows the Vth for a active channel length of 80 µm and a width of 20 µm. In each of FIGS. 9A-9C, it is shown that the ternary compound active layer has a high on-off ratio and a high current.

Figure 10A:
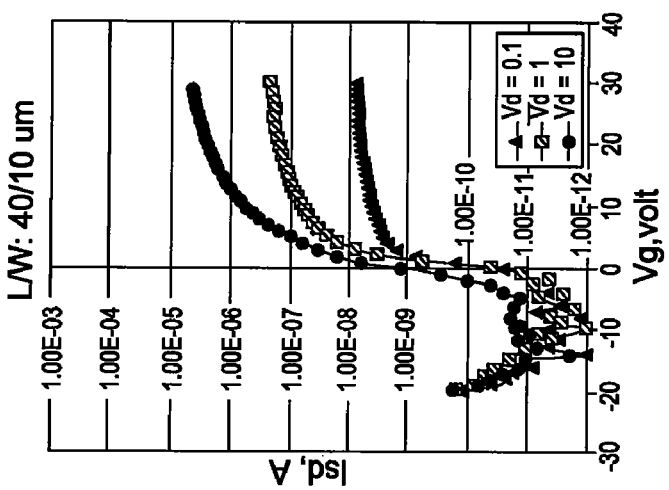
FIGS. 10A-10C show a comparison of the Vth for active channels having a common length and width.
Figure 10B:
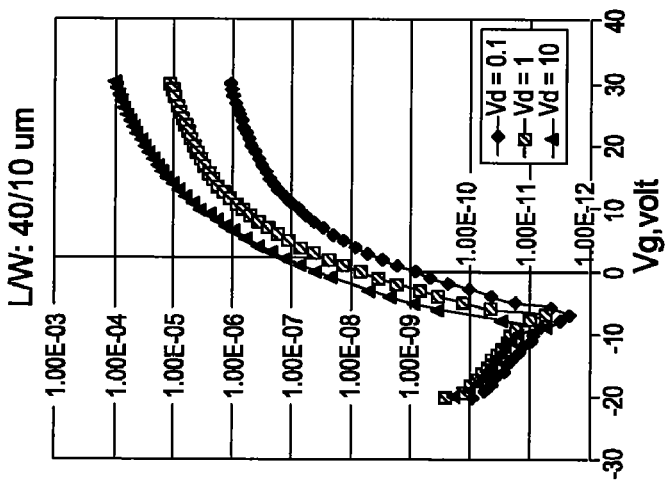
Figure 10C:
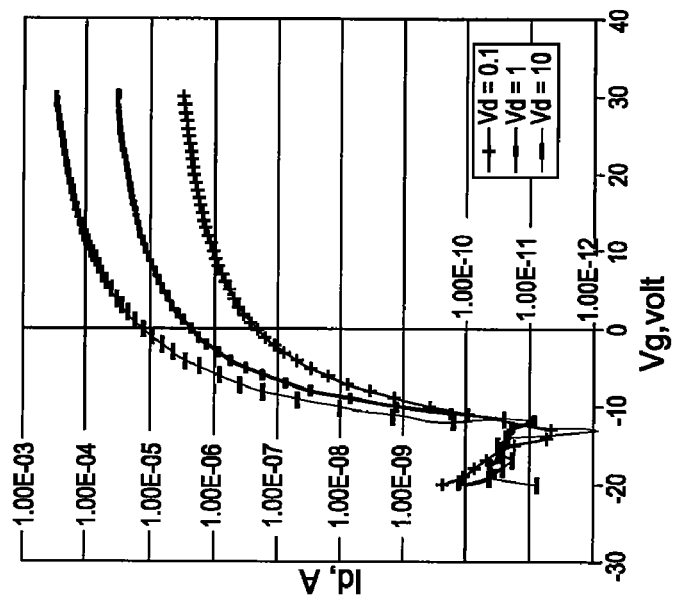

FIGS. 10A-10C show a comparison of the Vth for active channels having a common length and width. The active channel width is 40 µm and the width is 10 µm. FIG. 10A is the Vth for amorphous silicon. FIG. 10B is the ternary compound without annealing. FIG. 10C is the ternary compound after annealing. The ternary compound TFT of FIG. 10B has a drain-source current at Vg=1 that is higher than the drain-source current for amorphous silicon at 10 V. Therefore, the non-annealed film is about 10 times better than amorphous silicon.

The annealed film in FIG. 10C is even better. The annealed film has a high saturation current as compared to the non-annealed film. The source-drain current for the annealed film at Vd=0.1 V is close to the amorphous silicon TFT's current at Vd=10V. Thus, the annealed film is about 100 times better than the amorphous silicon.

The performance of the TFTs described above can be adjusted or tuned by changing the active layer carrier concentration, the active layer mobility, and the characteristics of the active layer at the interface with other layers. The TFTs may be tuned by changing the nitrogen containing gas flow rate during the film deposition. As noted above, the ratio of the nitrogen containing gas to the oxygen containing gas used in sputter deposition of the active layer may affect the mobility, carrier concentration, and other factors. A user may set a predetermined value for the carrier concentration, the mobility, or other characteristic and then adjust the nitrogen to oxygen flow ratio accordingly to produce the desired film properties. The adjustment may even occur in response to an in situ measurement to permit real time control of the deposition process.

The TFTs may also be tuned by the amount of aluminum doping. The amount of aluminum doping may be predetermined so that a sputtering target of appropriate composition may be disposed within the processing chamber. Additionally, the TFTs may be tuned by annealing and/or plasma treating the active layer after deposition or during integration with other films. As noted above, heat treating the ternary compound may increase the mobility of the film.

TFTs comprising oxygen, nitrogen, and one or more elements selected from the group consisting of zinc, tin, gallium, indium, and cadmium have increased mobility over TFTs made with amorphous silicon. The increased mobility of the TFTs permits the TFTs to be used not only for LCDs, but also for the next generation of displays, OLEDs.

While the foregoing is directed to embodiments of the present invention, other and further embodiments of the invention may be devised without departing from the basic scope thereof, and the scope thereof is determined by the claims that follow.

The invention claimed is:

1. A thin film transistor, comprising:
 a semiconductor layer in the transistor comprising an oxynitride compound comprising oxygen, nitrogen, and one or more elements selected from the group consisting of zinc, indium, tin, cadmium, gallium, and combinations thereof.

2. The transistor of claim 1, wherein the transistor is a top gate thin film transistor.

3. The transistor of claim 1, further comprising:
a substrate;
a gate electrode disposed over the substrate;
a gate dielectric layer disposed over the gate electrode;
the semiconductor layer disposed over the gate dielectric layer; and
source and drain electrodes disposed over the semiconductor layer and spaced apart to define an active channel.

4. The transistor of claim 3, further comprising an etch stop layer disposed over the semiconductor layer in the active channel.

5. The transistor of claim 1, wherein the semiconductor layer has a mobility of greater than about 50 $cm^2/V$-s.

6. The transistor of claim 1, wherein the oxynitride compound further comprises a dopant selected from the group consisting of Al, Ca, Si, Ti, Cu, Ge, Ni, Mn, Cr, V, Mg, and combinations thereof.

7. The transistor of claim 1, wherein the oxynitride compound comprises zinc.

8. The transistor of claim 7, wherein the oxynitride compound comprises aluminum dopant.

9. The transistor of claim 1, wherein the oxynitride compound comprises zinc, gallium, and indium.

10. The transistor of claim 9, wherein the oxynitride compound comprises aluminum dopant.

11. The transistor of claim 1, wherein the semiconductor layer additionally comprises a metal nitride.

12. The transistor of claim 11, wherein the semiconductor layer additionally comprises a metal oxide.

13. A thin film transistor, comprising: a semiconductor layer comprising an oxynitride compound that comprises zinc, oxygen and nitrogen, the semiconductor layer additionally comprising a metal nitride, a metal oxide or combinations thereof.

14. The transistor of claim 13, wherein the oxynitride compound further comprises a dopant.

15. The transistor of claim 14, wherein the dopant comprises aluminum.

16. A thin film transistor, comprising: a semiconductor layer comprising an oxynitride compound that comprises oxygen, nitrogen, indium, gallium and zinc, the semiconductor layer additionally comprising a metal nitride, a metal oxide or combinations thereof.

* * * * *